(12) United States Patent  
Chen et al.

(10) Patent No.: US 9,548,589 B2  
(45) Date of Patent: Jan. 17, 2017

(54) GRATING BASED OPTICAL TRANSMITTER

(71) Applicant: Forelux Inc., Taipei (TW)

(72) Inventors: Shu-Lu Chen, Taipei (TW); Yun-Chung Na, Taipei (TW)

(73) Assignee: FORELUX INC., Taipei (TW)

( * ) Notice: Subject to any disclaimer, the term of this patent is extended or adjusted under 35 U.S.C. 154(b) by 0 days.

(21) Appl. No.: 14/635,133

(22) Filed: Mar. 2, 2015

(65) Prior Publication Data

US 2015/0249321 A1 Sep. 3, 2015

Related U.S. Application Data

(63) Continuation-in-part of application No. 14/510,799, filed on Oct. 9, 2014, now Pat. No. 9,239,507.

(60) Provisional application No. 62/014,182, filed on Jun. 19, 2014, provisional application No. 62/012,446, filed on Jun. 16, 2014, provisional application No. (Continued)

(51) Int. Cl.

| | | |
|---|---|---|
| G02B 6/34 | (2006.01) | |
| H01S 5/20 | (2006.01) | |
| H01S 5/125 | (2006.01) | |
| H01S 5/183 | (2006.01) | |
| G02B 6/30 | (2006.01) | |
| G02F 1/225 | (2006.01) | |
| G02B 6/124 | (2006.01) | |
| G02B 6/122 | (2006.01) | |
| G02B 6/12 | (2006.01) | |

(52) U.S. Cl.  
CPC ............. *H01S 5/2054* (2013.01); *G02B 6/124* (2013.01); *G02B 6/30* (2013.01); *G02B 6/34* (2013.01); *G02F 1/2257* (2013.01); *H01S 5/125* (2013.01); *H01S 5/183* (2013.01); *G02B 6/1226* (2013.01); *G02B 2006/12104* (2013.01); *G02B 2006/12107* (2013.01)

(58) Field of Classification Search  
None  
See application file for complete search history.

(56) References Cited

U.S. PATENT DOCUMENTS 5,088,097 A * 2/1992 Ono .................. H01S 5/5045  
372/20  
6,031,243 A 2/2000 Taylor  
(Continued)

FOREIGN PATENT DOCUMENTS

EP 0322180 A2 6/1989  
EP 0430691 A2 6/1991

OTHER PUBLICATIONS

Search Report of the Corresponding European Patent Application No. 15157204.7.

*Primary Examiner* — Sung Pak  
*Assistant Examiner* — Hoang Tran  
(74) *Attorney, Agent, or Firm* — Chun-Ming Shih; HDLS IPR Services

(57) ABSTRACT

An optical transmitter including two reflective regions formed at two opposite ends of an interference region along a first direction and at least three electrodes electrically coupled to the interference region, where the amount of electrical carriers inside the interference region can be modulated by changing the relative electrical fields among the three electrodes, so that the amount of photons generated inside the interference region can be modulated and resonant along the first direction and emit along a second direction that is different from the first direction.

10 Claims, 31 Drawing Sheets

Related U.S. Application Data

61/979,489, filed on Apr. 14, 2014, provisional application No. 61/946,657, filed on Feb. 28, 2014, provisional application No. 62/089,169, filed on Dec. 8, 2014.

(56) References Cited

U.S. PATENT DOCUMENTS

| | | | |
|---|---|---|---|
| 2002/0136259 A1* | 9/2002 | Evans | H01S 5/187 372/102 |
| 2004/0076198 A1* | 4/2004 | Spoonhower | H01S 5/18366 372/20 |

* cited by examiner

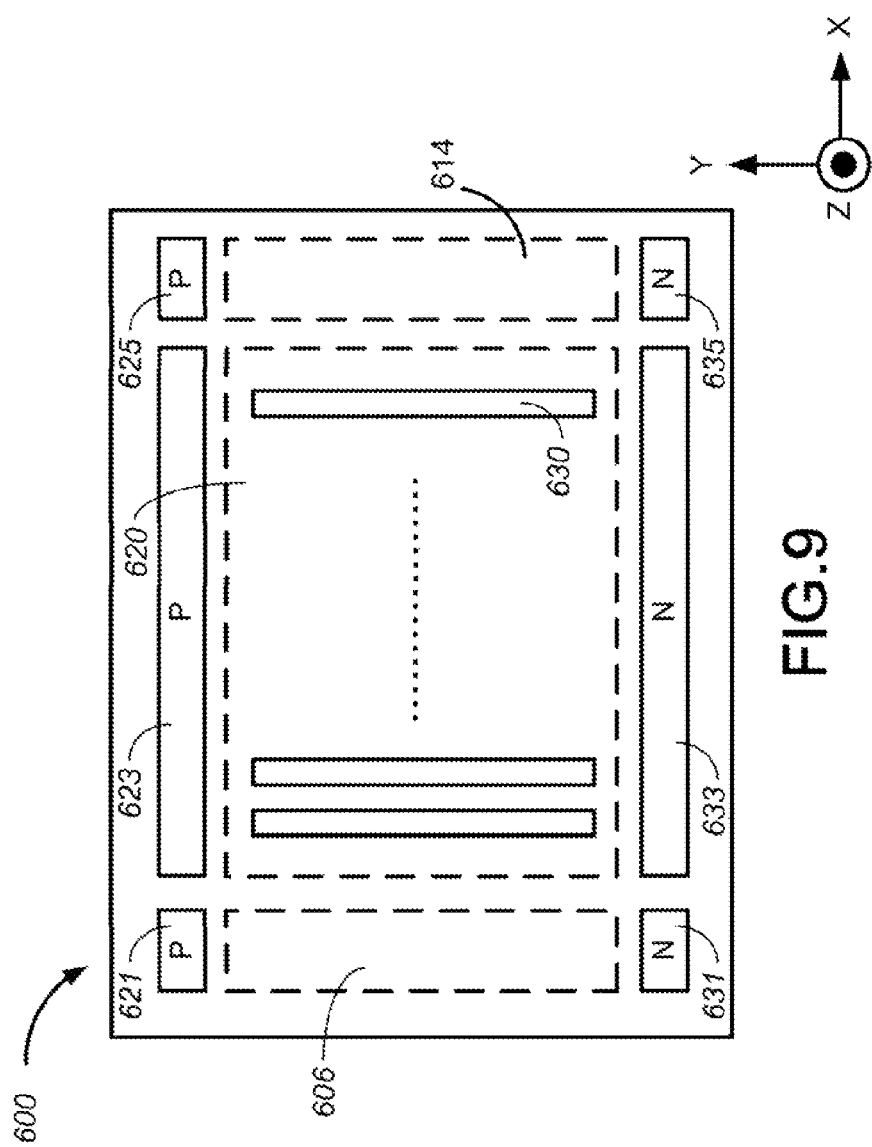

GRATING BASED OPTICAL TRANSMITTER

CROSS-REFERENCE TO RELATED APPLICATIONS

This patent application is continuation-in-part of U.S. application Ser. No. 14/510,799 filed on Oct. 9, 2014 and claims the benefit of U.S. Provisional Patent Application No. 62/014,182, filed Jun. 19, 2014, U.S. Provisional Patent Application No. 62/012,446, filed Jun. 16, 2014, U.S. Provisional Patent Application No. 61/979,489, filed Apr. 14, 2014, U.S. Provisional Patent Application No. 61/946,657, filed Feb. 28, 2014, which is incorporated by reference herein.

BACKGROUND

This specification relates to coupling light using a grating.

Light propagates inside a photonic integrated circuit, and is coupled to an external medium through a grating fabricated on the photonic integrated circuit.

SUMMARY

According to one innovative aspect of the subject matter described in this specification, light may be generated, guided, processed, or detected by one or more active and/or passive optical components of a photonic integrated system. A grating may be formed on an interference region of the photonic integrated circuit, where the interference region may be bounded by one or more reflectors. By matching a grating profile with an interference pattern produced by the one or more reflectors, light may reciprocally enter or exit the photonic integrated circuit at a specific angle from or to an external medium, respectively.

In general, one innovative aspect of the subject matter described in this specification can be embodied in an optical transmitter that includes an interference region formed between a first reflector region and a second reflector region along a first direction; a first electrode and a second electrode electrically coupled to the interference region, the first electrode and the second electrode configured to generate light in the interference region through an electrical carrier injection by an electrical field applied between the first electrode and the second electrode; and a third electrode electrically coupled to the interference region, the third electrode configured to modulate an electrical carrier concentration in the interference region by an electrical field applied (i) between the first electrode and the third electrode or (ii) between the second electrode and the third electrode; wherein the generated light resonates along the first direction and emits along a second direction different from the first direction.

This and other implementations can each optionally include one or more of the following features. A grating region coupled to the interference region and is configured to direct the light out of the interference region along the second direction. The second direction may be substantially perpendicular to the first direction. The interference region contains at least two different layers of semiconductor materials and the first electrode and the third electrode are physically in contact to different layers of materials of the interference region. For example, different layers including a N type doped InP layer and a P type InP doped layer. A dielectric layer is formed between the third electrode and the interference region and the third electrode is configured to modulate the amount of electrical carriers recombined in the interference region through a capacitive effect. The first reflector region or the second reflector region includes one of a corner mirror, a DBR mirror, a dispersive mirror, a waveguide loop mirror, or a metal layer. The first electrode, the second electrode or the third electrode includes a conducting layer and a doped semiconductor region. When applying electrical field to the third electrode, at least two different voltage levels can be applied to the third electrode in sequence to modulate the amount of electrical carriers recombined in the interference region and the output light power level.

This and other implementations can each optionally include one or more of the following features. The effective refractive index of the interference region may be lower than the effective refractive index of the grating region. A grating periodicity of the grating region substantially matches an interference periodicity of the light inside the interference region. A grating has lattice vectors formed so that the locations of the in-phase antinodes of the light inside the interference region substantially match the locations of the grating valleys or peaks. At least part of the interference region that the third electrode is physically in contact to is not overlapping with the grating region.

This and other implementations can each optionally be formed by first forming an interference region and a light source region wherein at least part of the light source region is embedded in the interference region. A first reflector region and a second reflector region are formed at two opposite ends of the interference region on a layer, and at least three electrodes electrically coupled to the light source region are formed and arranged to provide a control for relative electrical fields among the three electrodes to modulate an electrical carrier concentration. The light generated by the electrical carrier recombination then resonates inside the interference region along a first direction and emits out of the interference region along a second direction that is different from the first direction.

Advantageous implementations may include one or more of the following features. Light may be coupled in or out of a photonic integrated circuit at an angle that is substantially perpendicular to the propagation direction of the light inside the photonic integrated circuit. This perpendicularity may reduce packaging cost and complexity. The interference region or grating may be actively tuned by mechanisms including electrical field, magnetic field or mechanical movement, to control the coupling of light and amount of light generated inside the interference region. The interference region is coupled to an active medium that generates light at a broad wavelength range and may be used to select a narrower wavelength range from the broad wavelength range. In some implementations, three electrical terminals may be used wherein two of the electrical terminals are used primarily to inject electrical carriers and the other electrical terminal is used primarily to modulate the location and concentration of the injected electrical carriers inside the interference region.

Other implementations of this and other aspects include corresponding systems, apparatus, and computer programs, configured to perform the actions of the methods, encoded on computer storage devices. A system of one or more computers can be so configured by virtue of software, firmware, hardware, or a combination of them installed on the system that in operation cause the system to perform the actions. One or more computer programs can be so configured by virtue of having instructions that, when executed by data processing apparatus, cause the apparatus to perform the actions.

The details of one or more implementations are set forth in the accompanying drawings and the description below. Other potential features and advantages will become apparent from the description, the drawings, and the claims.

BRIEF DESCRIPTION OF THE DRAWINGS

FIG. 9 shows an example of an optical coupler integrated with p-n junctions.

Like reference numbers and designations in the various drawings indicate like elements. It is also to be understood that the various exemplary embodiments shown in the figures are merely illustrative representations and are not necessarily drawn to scale.

DETAILED DESCRIPTION

Figure 1A:
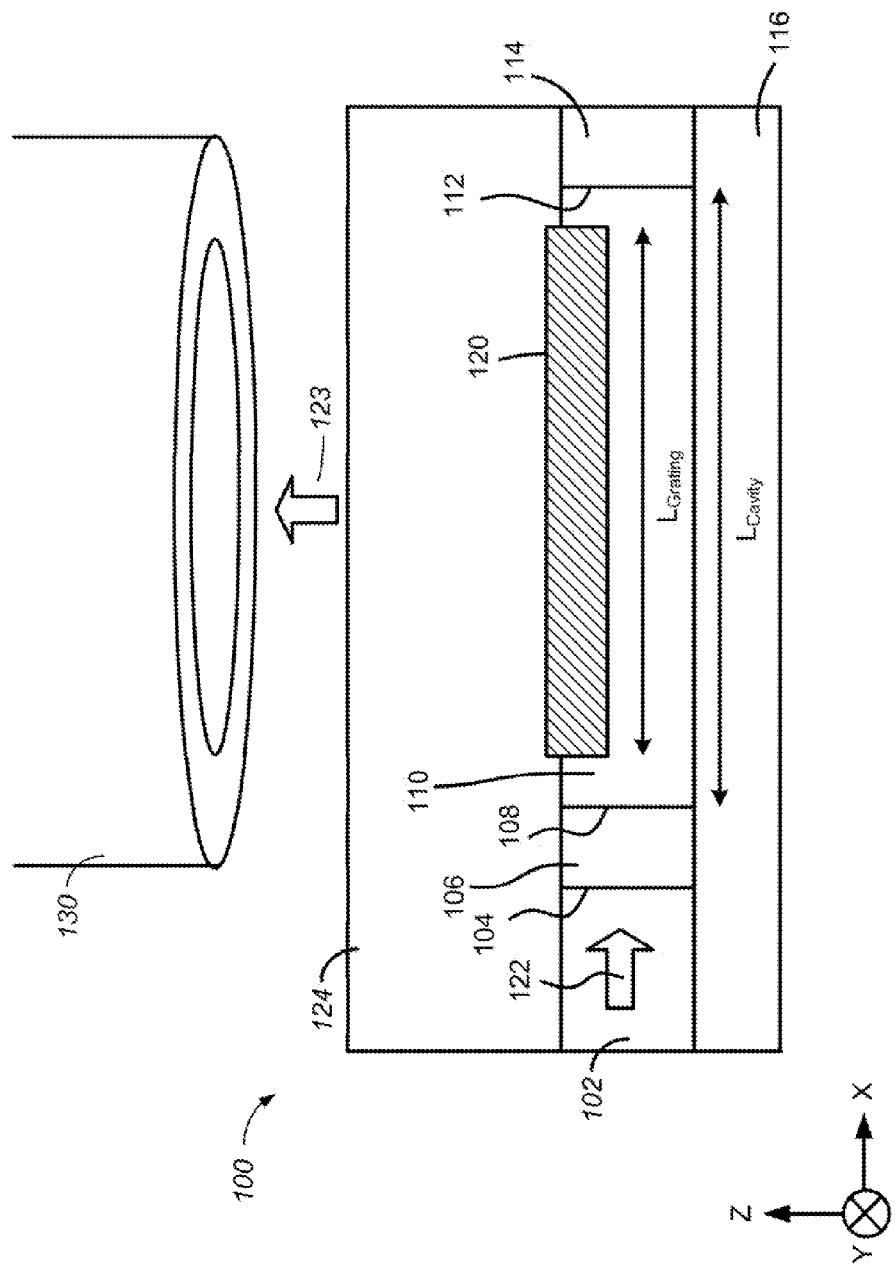
FIG. 1A is a block diagram of an example photonic integrated circuit.

FIG. 1A is a block diagram of an example photonic integrated circuit 100 that includes an grating-based optical coupler for enabling the coupling of light into and out of a photonic integrated circuit 100. In general, an optical coupler with substantial vertical emission is useful for interfacing surface-emitting/receiving optoelectronic devices, and can reduce the packaging cost and complexity due to off-normal configuration.

The photonic integrated circuit 100 includes one or more optical components fabricated on a substrate 116. The optical components include a waveguide region 102, a first reflector region 106, an interference region 110, a second reflector region 114, and a grating region 120. The substrate 116 may be any type of substrate that is suitable for fabricating a photonic integrated circuit. For example, the substrate 116 may be a silicon wafer, a silicon-on-insulator (SOI) wafer, a III-V semiconductor such as a gallium arsenide (GaAs) or an indium phosphide (InP) wafer, or a glass wafer. As another example, the substrate 116 may be a layer of passive or active material deposited over an integrated electronic circuit. As another example, the substrate 116 may be a layer of passive or active material deposited over another integrated photonic circuit.

In general, the waveguide region 102 is configured to confine light along one or more dimensions to guide light along a specific direction. In some implementations, the waveguide region 102 may confine light along one dimension. For example, the waveguide region 102 may be a slab waveguide that confines light along the z direction. In some implementations, the waveguide region 102 may confine light along two dimensions. For example, the waveguide region 102 may be a rib waveguide or a channel waveguide that confines light along the y and z directions, such that the light may propagate along the x direction, as designated by the arrow 122. The term "along the x direction" and their derivatives as used herein may be used to represent bidirectional (±x direction), or unidirectional (+x, −x). Furthermore, when light is traveling inside a multi-mode fiber placed along the x direction, some portions of the light may travel in zigzag routes inside the fiber while the overall direction may still be regarded as along the x direction.

In general, the first reflector region 106 and the second reflector 114 are configured to reflect incident light. For example, when light in the waveguide region 102 is incident on an interface 104, some portion of the light may be reflected back to the waveguide region 102, while the remaining portion of the light may be transmitted to the first reflector region 106. Similarly, when light in the first reflector region 106 is incident on an interface 108, some portion of the light may be reflected, while the remaining portion of the light may be transmitted to the interference region 110. Similarly, when light in the interference region 110 is incident on an interface 112, some portion of the light may be reflected, while the remaining portion of the light may be transmitted to the second reflector region 114. In some implementations, a reflector may be an interface between two mediums with different refractive indices.

The portion of the light that is reflected by a reflector may range from near zero percent to near one hundred percent, depending on the design. In some implementations, the first reflector region 106 or the second reflector 114 may be highly reflective. For example, the second reflector 114 may be coated with a metal, such as aluminum, to achieve a high reflectivity. As another example, light may be arrange to be incident on the second reflector 114 beyond a critical angle, where the light is reflected through total internal reflection. As another example, the second reflector 114 may be a Bragg reflector that provides high reflectivity for a range of wavelengths. As another example, the first reflector region 106 may comprise one or multiple slits disconnecting the waveguide region 102 and the interference region 110. As another example, the first reflector region 106 may comprise DBR structure. As another example, the first reflector region 106 may be an anomalous dispersive mirror having multiple high/low refractive index structures in the x direction to compensate the wavelength-dependent optical phase of the interference region and achieve a wider bandwidth of operation.

In some implementations, the first reflector region 106 or the second reflector 114 may be partially transmissive and partially reflective. For example, the first reflector region 106 may be configured to (i) reflect, by a particular reflectivity, a portion of incident light, and (ii) transmit another portion of the incident light. A partial reflective reflector may be implemented, for example, by depositing a dielectric material having a refractive index that is lower than the material of the waveguide region 102 in the corresponding reflector region. The percentage of reflected and transmitted light may be calculated using Fresnel equations.

In general, the interference region 110 acts as a cavity having a cavity length, $L_{Cavity}$, that is formed between the waveguide region 102 and the second reflector region 114. In some implementations, the first reflector region 106 may be formed between the waveguide region 102 and the interference region 110, where $L_{Cavity}$ may be defined as the length between the first reflector region 106 and the second reflector region 114. In some implementations, an effective refractive index of the waveguide region 102 may be substantially equal to an effective refractive index of the interference region 110. For example, both the waveguide region 102 and the interference region 110 may be fabricated in silicon with the same cross sectional waveguide dimensions along the y-z dimensions. In this case, the effective refractive index of the waveguide region 102 is equal to an effective refractive index of the interference region 110. As another example, both the waveguide region 102 and the interference region 110 may be fabricated in silicon, but the cross sectional waveguide dimensions along the y-z dimensions may vary, which may cause a difference between the effective refractive index of the waveguide region 102 and the effective refractive index of the interference region 110. In this case, the effective refractive index of the waveguide region 102 is treated as substantially equal to the effective refractive index of the interference region 110 as long as a resulting performance degradation, such as an optical loss, caused by the effective refractive index difference is within a range that is acceptable for a targeted application.

The interference region 110 is configured to confine an interference light formed by an incident light and a reflected incident light. For example, a standing wave pattern between the first reflector 106 and the second reflector 114 may be formed in the interference region 110. To have interference formed in the interference region 110, the length of the cavity $L_{Cavity}$ and the parameters of grating region 120 are chosen so that the incident light may reach to and get reflected by the second reflector 114 without being totally attenuated in the first pass propagating from the first reflector 106 to the second reflector 114. In some implementations, the confinement may be a partial confinement, where a portion of the interference light is transmitted through the first reflector 106 back to the waveguide region 102 and/or a portion of the interference light is transmitted through the second reflector 114. The interference of light formed by the incident light and the reflected incident light is described in more details in FIG. 2.

In some implementations, an optical path length of the interference region 110 may be longer than a wavelength of the guided light. In some other implementations, an optical path length of the interference region 110 may be shorter than the wavelength of the guided light. For example, for an interference region 110 composed of silicon having a cavity length of 0.4 µm and a refractive index of 3.45, the interference region 110 has an optical path length of 0.4 µm×3.45=1.38 µm. If the wavelength of the guided light has a wavelength of 1.55 µm, the optical path length of the interference region 110 is shorter than the wavelength of the guided light. In this case, the light having the 1.55 µm wavelength may be coupled to the grating region 120 through an evanescent field of the light confined (partial confinement) in the interference region 110.

In general, the grating region 120 having a grating length of, $L_{Grating}$, is configured either to couple at least a portion of the light in a photonic integrated circuit 100 to an external medium 130, or to couple at least a portion of the light from the external medium 130 to the photonic integrated circuit 100. In some implementations, the grating length $L_{Grating}$ may be shorter than the cavity length $L_{Cavity}$. In some other implementations, the grating length $L_{Grating}$ may be equal to the cavity length $L_{Cavity}$. In some other implementations, the grating length $L_{Grating}$ may be longer than the cavity length $L_{Cavity}$. For example, the grating region 120 may be fabricated on the interference region 110, but a portion of the grating region 120 may be extended into the waveguide region 102, and/or the first reflector region 106, and/or the second reflector region 114. As used in this specification, the grating is formed or fabricated on a region means that the grating is formed above the region, or the grating is embedded at least partially inside the region. For example, the grating may be formed by etching into the region which the grating is disposed over.

In some implementations, the interference region 110 and the grating region 120 may have the same material composition. For example, the grating region 120 may be fabricated by etching a grating pattern directly on the surface of the interference region 110. In some other implementations, the interference region and the grating region may have different material compositions. For example, the grating region 120 may be fabricated by depositing silicon dioxide on the surface of a silicon-based interference region 110. A grating pattern may then be etched on the surface of the silicon dioxide to form an oxide grating. As another example, the grating region 120 may be fabricated by depositing metal on the surface of the interference region 110 and then be etched to form a metal grating. As another example, the grating region 120 may be fabricated by depositing a higher refractive index material on the surface of the interference region 110 having a lower refractive index to improve the grating efficiency by attracting the optical mode toward the grating side. The lower refractive index material can for example be InP and the higher refractive index material can for example be Si.

In general, the grating region 120 redirects light propagating along a first direction to a second direction that is different from the first direction. In some implementations, the grating region 120 may redirect light propagating along a first direction to a second direction that is substantially perpendicular to the first direction. For example, by substantially matching a grating periodicity of a grating region 120 to the interference periodicity of a standing wave pattern in the interference region 110, the grating region 120 may redirect the light propagating inside the waveguide region 102 along the x direction, as designated by the arrow 122, to a perpendicular direction along the z direction, as designated by the arrow 123. The term "substantially match" as used in this application means that a resulting performance degradation, such as an optical loss, due to the mismatch is within an acceptable range for a targeted application. An acceptable range may be, for example, within an order of magnitude. In some other implementations, the grating region 120 may redirect light propagating along the first direction to a second direction that is not substantially perpendicular to the first direction. The term "substantially perpendicular" as used in this application means 90 degrees with an error margin that is acceptable for a targeted application.

The external medium 130 may be any medium that can transmit, guide, detect, or generate light. For example, the external medium 130 may be an optical fiber. As another example, the external medium 130 may be a photo-detector. As another example, the external medium 130 may be a light source. In some implementations, a cladding 124 may be formed between the grating region 120 and the external medium 130. The cladding 124 may be formed to protect the photonic integrated circuit 100, or to provide a specific distance between the grating region 120 and the external medium 130. In some implementations, a cross-sectional mode profile of the light emitted from the grating region 120 may be designed to substantially match a cross-sectional mode profile of the external medium 130 configured to receive the light emitted from the grating region. For example, the cross-sectional mode profile of the light emitted from the grating region 120 in the x-y dimensions may be designed to substantially match the cross-sectional mode profile of the single mode fiber in the in the x-y dimensions.

Figure 1B:
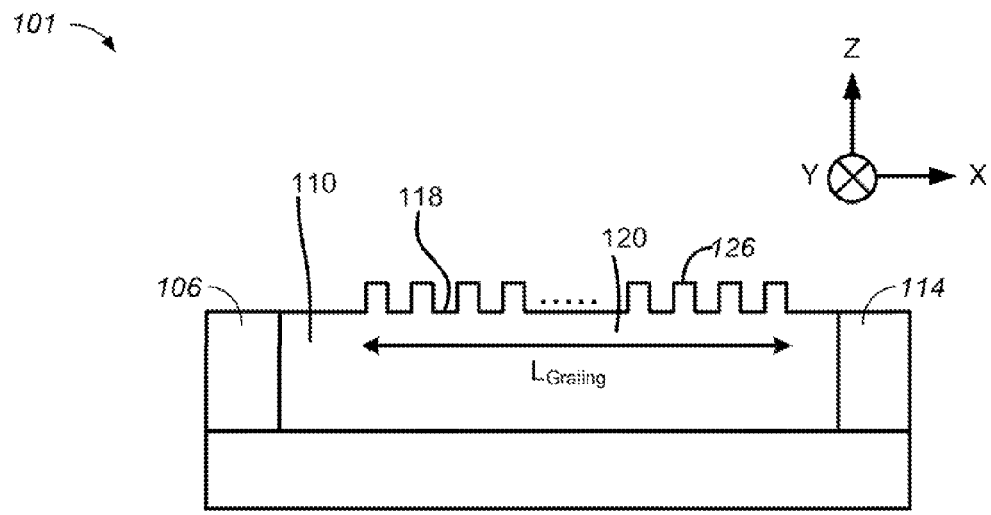
FIGS. 1B, 1C, and 1D show examples of an optical coupler.

FIG. 1B shows an example of an optical coupler 101 that may be implemented in the photonic integrated circuit 100. The optical coupler 101 may also be implemented in any one of the other photonic integrated circuits described throughout this application, or in another photonic integrated circuit not described in this application.

The optical coupler 101 includes an interference region 110 and a grating region 120. The grating region 120 includes grating valleys 118 and grating peaks 126, which together form a grating having a grating length, $L_{Grating}$. The height difference between a grating peak 126 and a grating valley 118 determines a grating height. The ratio of the peak width to the sum of peak width and valley width of the grating along the wave propagation direction determines the duty cycle of the grating. The sum of the grating peak width and the grating valley width determines the period of the grating. By tuning the grating height, the duty cycle, the grating period, the grating shapes, the cladding covering the grating, or a combination of the above, the directionality and far field angle of light emitted/received by the grating region 120 can be determined. For example, the grating height and the duty cycle may be modified to optimize the directionality of the light. As another example, the grating period and the duty cycle may be tuned to achieve the desired far field angles which might be most suitable for a targeted application.

In some implementations, the height of the grating peaks may be higher than the height of the first reflector region 106 and/or the second reflector region 114. For example, the first reflector region 106, the interference region 110, and the second reflector region 114 may be planarized by polishing, and then another layer of material is deposited on the planarized surface so that the grating region 120 may be formed by patterning and etching.

Figure 1C:
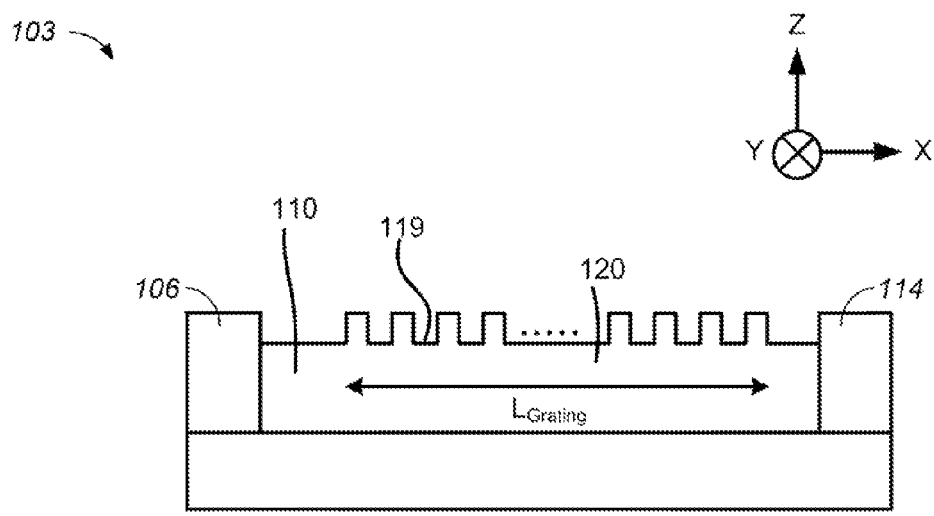

In some other implementations, the height of the grating valleys may be lower than the height of the first reflector region 106 and/or the second reflector region 114. FIG. 1C shows an example of an optical coupler 103 where the height of the grating valleys 119 is lower than the height of the first reflector region 106 and the second reflector region 114. For example, the first reflector region 106, the interference region 110, and the second reflector region 114 may be planarized by polishing, and then the grating region 120 may be formed on the polished surface by patterning and etching the interference region 110. The optical coupler 103 may be implemented in the photonic integrated circuit 100. The optical coupler 103 may also be implemented in any one of the other photonic integrated circuits described throughout this application, or in another photonic integrated circuit not described in this application.

Figure 1D:
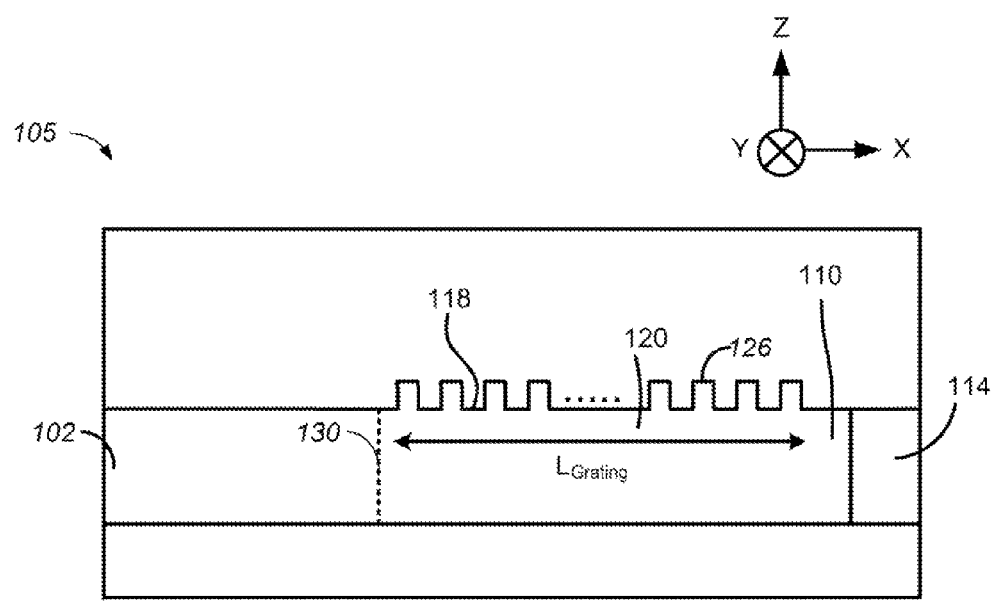

FIG. 1D shows an example of an optical coupler 105 that includes the waveguide region 102, the interference region 110, the grating region 120, and the second reflector region 114, but does not include the first reflector region 106. The boundary 130 between the waveguide region 102 and the interference region 110 is denoted by a dashed line 130 because in some implementations, the waveguide region 102 and the interference region 110 are composed of the same material or having substantially equal effective refractive index.

The optical coupler 105 does not include the first reflector region 106 in the case where light in the interference region 110 is attenuated below a threshold value after propagating one-circulation in the interference region 110. For example, a standing wave may be created in the interference region 110 through interference between forward light incident on the second reflector region 114 and backward light reflected by the second reflector region 114. The standing wave may diminish near the boundary 130 between the waveguide region 102 and the interference region 110 because the light reflected by the second reflector region 114 is attenuated below the threshold value beyond the boundary 130. The threshold value, for example, may be less than 10% of the initial incident light power. By substantially matching a grating pattern in the grating region 120 with the standing wave pattern in the interference region 110, the optical coupler 105 can be used to redirect light propagating along a first direction to a second direction that is different to the first direction without the first reflector region 106. For example, the optical coupler 105 may be used to direct light to a second direction that is substantially perpendicular to the first direction. In some implementations, without the first reflector region 106, the optical coupler can still redirect an incident light with high efficiency if the light is attenuated below a threshold value after propagating one-circulation in the interference region 110. In some implementations, to maintain high efficiency without introducing the first reflector region 106, the grating region 120 needs to provide enough one-circulation attenuation. For example, the grating length $L_{Grating}$ needs to be long enough to provide sufficient one-circulation attenuation before reaching the boundary 130.

Figure 2:
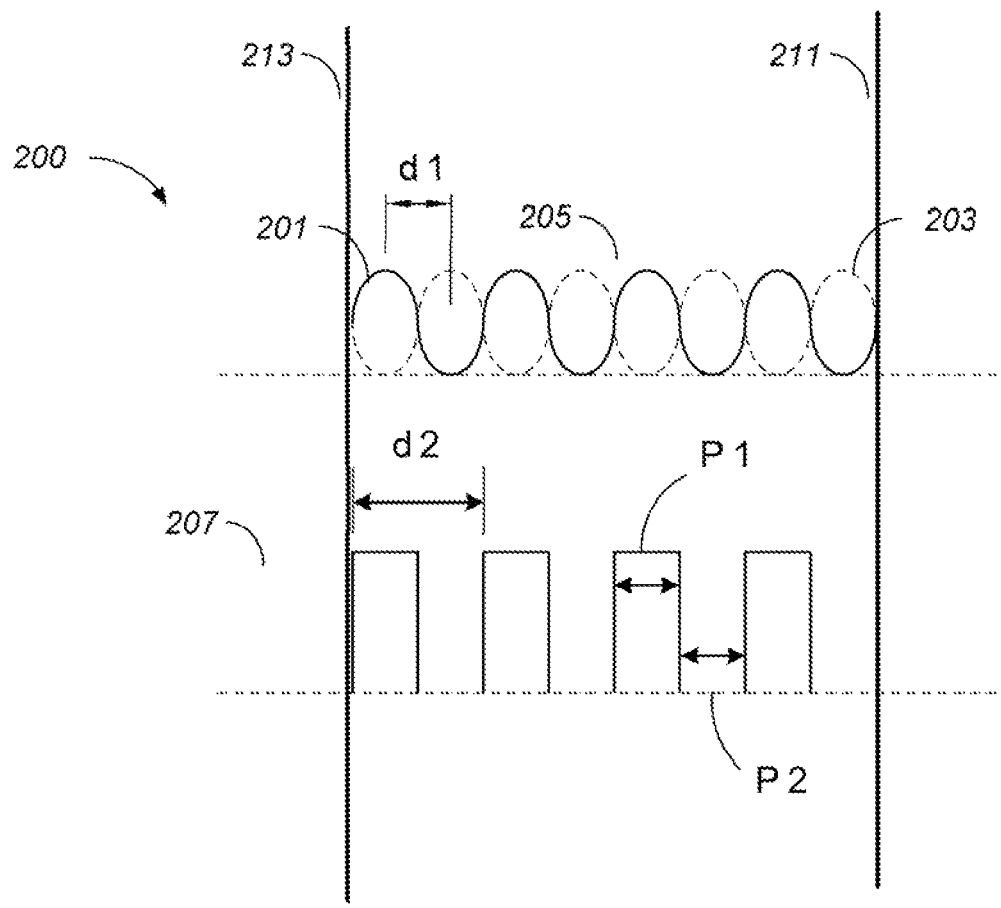
FIG. 2 is an example of interference patterns.

FIG. 2 is an example of a grating pattern 207 that substantially matches an interference periodicity of the standing wave 205 inside the interference region. The descriptions of FIG. 2 may be applied to any one of the optical couplers described in this application. Generally, the round-trip phase shift is the sum of the phase shift introduced by the one-circulation propagation and the phase shift introduced by a reflector. To simplify the description, the phase shift introduced by the reflector may be assumed to be zero so that the resonant condition "round-trip phase shift equals $2m\pi$" can be viewed as the same as "one-circulation phase shift equals $2m\pi$," where m is any integer.

In some implementations, light propagating in a waveguide may be confined by two dimensions. For example, referring to FIG. 1A, light propagating in the waveguide region 102 is confined in y and z dimensions. When the light enters an interference region, the confinement of the waveguide may be weakened, and the light propagates like a point wave inside the interference region. For example, the interference region 110 may be designed to confine light tightly in the z dimension and confine light loosely in the y dimension. The point wave reaches a reflector 211, gets reflected, and a standing wave pattern 205 having a periodicity of d1 may be formed inside the interference region through the interference of a forward propagating wave 201 and a backward propagating wave 203.

In some implementations, a grating pattern 207 may be designed to substantially match the standing wave pattern 205. By matching the standing wave pattern 205, this grating pattern 207 may act as an optical antenna and become the most efficient way for light to leave the interference region. Each grating structure may act to emit the light as a point wave, and all point-wave fronts emitted from individual grating structures are combined into a planar wave front which propagates in a perpendicular direction with low loss. For example, one theoretical condition for an ideal match may be d2=2×d1.

Based on the material quality and the physical dimensions of the interference region and grating structure, an one-circulation attenuation coefficient, $\alpha$, may be calculated along with a corresponding phase shift for the resonant condition inside the interference region. For example, the interference region may be composed of a material that has a specific absorption coefficient for the guided light, which contributes to the one-circulation attenuation coefficient. As another example, light may be emitted by the grating region during propagation, which also contributes to the one-circulation attenuation coefficient. In general, light is attenuated based on an one-circulation attenuation coefficient after propagating one-circulation in the interference region (i.e., forward propagation from the boundary 213 to the reflector 211, and then backward propagation from the reflector 211 to the boundary 213). The term "one-circulation attenuation coefficient $\alpha$" as used in this application refers to a ratio between the remaining optical power after the one-circulation attenuation and the initial optical power.

In some implementations, to substantially reduce back reflection loss, a reflector region (e.g., the first reflector region 106) may be placed at the boundary 213, where the reflectivity of the reflector region at the boundary 213 is configured to substantially match the one-circulation attenuation coefficient $\alpha$. By substantially matching the reflectivity of the reflector region at the boundary 213 with $\alpha$, the light (from the left-hand side of 213) reflected from the boundary 213 back to the incident light source (at the left-hand side of 213) and the light (from the right-hand side of 213) transmitting through the boundary 213 back to the incident light (at the left-hand side of 213) cancel with each other after multiple passes due to destructive interference, meaning almost all the power of the original incident light (incident from the left of 213 into the region between 213 and 211) is transferred into the region between 213 and 211. In some implementations, the one circulation attenuation coefficient $\alpha$ may be near zero. In this case, the corresponding reflectivity r at the boundary 213 can be set as zero, which corresponds to the optical coupler 105 in FIG. 1D, where the first reflector region 106 is not included in the optical coupler 105. In some implementations, the reflectivity r at the boundary 213 can be set as high as the reflectivity of the reflector 211, (e.g., close to 1), to form a highly confined cavity along the x direction, where the light can enter or leave the cavity through another direction such as in the z direction.

In some implementations, there may be non-ideal factors that affect the performance. For example, a change of effective refractive index may occur from the etching of the grating region on the interference region. As another example, the etching process may not create a straight line from the grating peak to the grating valley. While the theoretical matching condition is d2=2d1, slight deviation from the exact condition may be expected during real implementation. Such deviation does not change the functionality of the optical coupler, but may affect the efficiency. However any reasonable deviation from the ideal case is within the scope of this disclosure, where the efficiency is acceptable for a targeted application. An iterative process of fabricating the optical coupler, testing the optical coupler, and then re-designing the optical coupler may improve this issue.

Figures 3A, 3B, 3C, 3D, 3E:
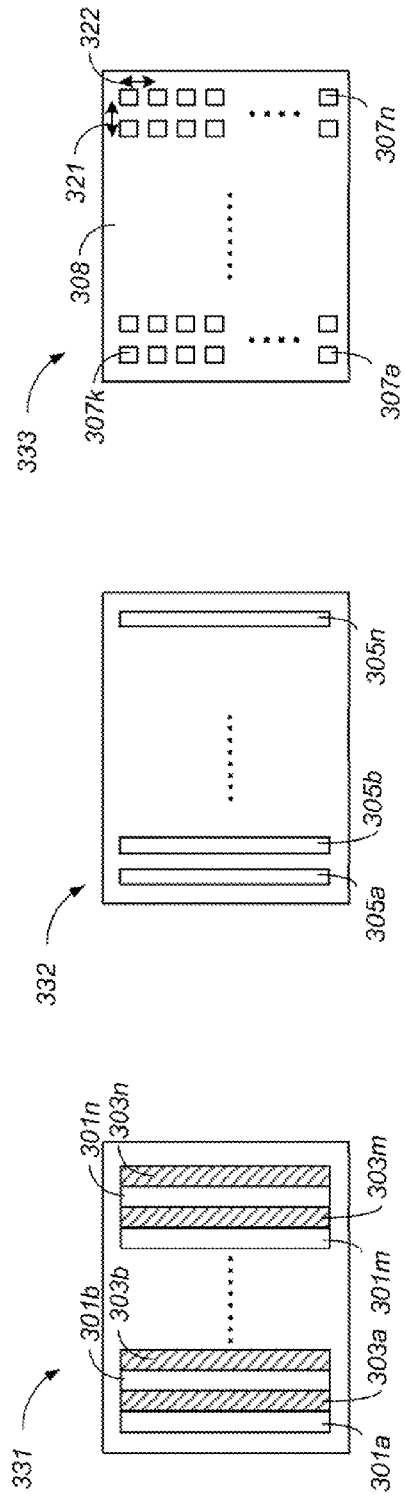
FIGS. 3A-3E show examples of a grating pattern.

FIG. 3A shows an example of a view of a grating pattern 331 on a plane along the x-y dimensions. The descriptions of FIG. 3A may be applied to any one of the optical couplers described in this application. The grating pattern 331 includes an array of one-dimensional grating structures 301a-n and 303a-n along the x direction, where n is any integer greater than one. In some implementations, the grating structures 301a-n and 303a-n may be composed of different materials. For example, the grating structures 301a-n may be composed of silicon, and the grating structures 303a-n may be composed of InP. As another example, the grating structures 303a-n may include a layer of metal that forms surface plasmonic effect that couples light from an external medium to the interference region. The arrangement of 301a, 303a, 301b, 303b, . . . , 301n, and 303n forms the grating in a grating region.

FIG. 3B shows an example of a view of a grating pattern 332 on a plane along the x-y dimensions. The descriptions of FIG. 3B may be applied to any one of the optical couplers described in this application. The grating pattern 332 includes an array of one-dimensional grating structures 305a-n along the x direction, where n is any integer greater than one. In some implementations, the grating structures 305a-n may be grating peaks of a grating. In some other implementations, the grating structures 305a-n may be grating valleys of a grating. The arrangement of 305a, 305b, . . . , and 305n forms the grating in a grating region.

FIG. 3C shows an example of a view of a grating pattern 333 on a plane along the x-y dimensions. The descriptions of FIG. 3C may be applied to any one of the optical couplers described in this application. The grating pattern 333 includes an array of two-dimensional rectangular grating structures 307a to 307n along the x direction, and 307a to 307k along the y direction. In some implementations, the rectangular grating structure 307a may be a grating peak of a grating. In some other implementations, the rectangular grating structure 307a may be a grating valley of a grating. In some implementations, the rectangular grating structure 307a may be composed of the same material as the layer 308, such as silicon. In some implementations, the rectangular grating structure 307a may be composed of a different material from the layer 308. For example, the rectangular grating structure 307a may be composed of silicon, and the layer 308 may be composed of InP. In some implementations, the rectangular grating structure 307a may be a square or a non-square, or combinations of both structures. The arrangement of the rectangular grating structures 307a-n and 307a-k on the x-y plane forms the grating in a grating region. In some implementations, the period of the grating along the x direction 321 and period of the grating along the y direction 322 substantially match the interference pattern in the layer 308 along the x and y directions, respectively.

FIG. 3D shows an example of a view of a grating pattern 334 on a plane along the x-y dimensions. The descriptions of FIG. 3D may be applied to any one of the optical couplers described in this application. The grating pattern 334 includes an array of two-dimensional arbitrary-shaped grating structures 309a to 309n, where n is any integer greater than one. In some implementations, the arbitrary-shaped grating structure 309a may be a grating peak of a grating. In some other implementations, the arbitrary-shaped grating structure 309a may be a grating valley of a grating. In some implementations, the arbitrary-shaped grating structure 309a may be composed of a different material from the layer 310. For example, the arbitrary-shaped grating structure 309a may be composed of silicon-dioxide, and the layer 308 may be composed of silicon. In some implementations, the arbitrary-shaped grating structure 309a may be a triangle or an ellipse or combinations of different shapes. The arrangement of the arbitrary-shaped grating structures 309a-n on the x-y plane forms the grating in a grating region.

FIG. 3E shows an example of a view of a grating pattern 335 on a plane along the x-y dimensions. The descriptions of FIG. 3E may be applied to any one of the optical couplers described in this application. The grating pattern 335 includes an array of two-dimensional arbitrary-shaped grating structures 313a to 313n, where n is any integer greater than one. In some implementations, the shape of any one of the arbitrary-shaped grating structures 313a to 313n may be determined using numerical analysis. For example, a Finite-difference time-domain (FDTD) analysis program may be used to design the shape of each of the arbitrary-shaped structures 313a to 313n that optimizes the coupling efficiency. In some implementations, the distance between each one of the arbitrary-shaped grating structures 313a to 313n may be determined using numerical analysis. For example, a Finite-difference time-domain (FDTD) analysis program may be used to determine the distance between each one of the arbitrary-shaped structures 313a to 313n that optimizes the coupling efficiency. The arrangement of the arbitrary-shaped grating structures 313a-n on the x-y plane forms the grating in a grating region.

In some implementations, the two-dimensional gratings shown in FIG. 3C, FIG. 3D, and FIG. 3E, can have lattice vectors (which define the unit cell size and shape) designed so that the locations of the in-phase antinodes of the interference region substantially match the locations of grating valleys and/or peaks.

Figure 4A:
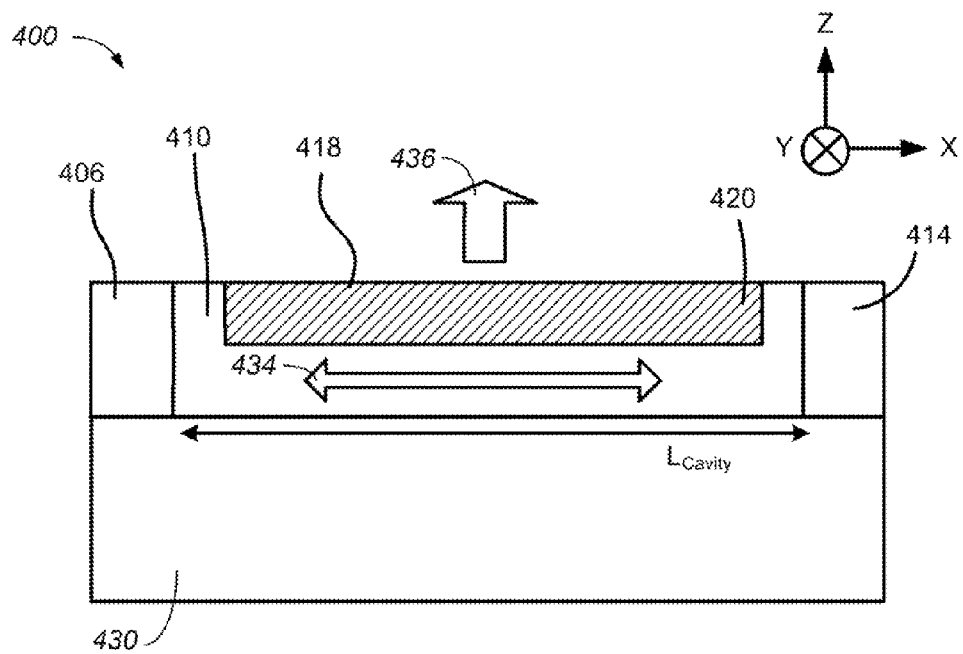
FIGS. 4A-4F show examples of an optical coupler integrated with a light source.

FIG. 4A shows an example photonic integrated circuit 400 having a grating based optical coupler formed on a light source. The photonic integrated circuit 400 includes a light source region 430 configured to generate incident light. In some implementations, the light source region 430 may generate incoherent light. For example, a III-V quantum well or quantum dot laser diode may include one or more layers of active materials that generate incoherent light when pumped with electrical carriers. In some implementations, the incoherent light may be coupled to the interference region 410 through spontaneous emission. In some implementations, the light source region 430 may be confined at other surfaces except the surface coupled to the interference region 410.

The optical coupler includes a first reflector region 406, a second reflector region 414, an interference region 410, and a grating region 420. The structures of the first reflector region 406, the second reflector region 414, the interference region 410, the grating region 420, and the grating 418 may be implemented by any corresponding structures described throughout this application, for example, the corresponding structures in FIGS. 1A-3E. In some implementations, the interference region 410 and the grating region 420 is composed of silicon or III-V semiconductors, the light source region is composed of III-V semiconductors, and the first and second reflector regions 406 and 414 include DBR structures or metal coating.

The first reflector region 406 and the second reflector region 414 are configured to reflect incident light at a direction that is opposite to a propagation direction of the incident light as indicated by the arrow 434. The interference region 410 is formed between the first reflector region 406 and the second reflector region 414 and is coupled to the light source region 430. The interference region 410 may be configured to (i) guide the light generated by the light source region 430 to propagate along a first direction (the x direction in FIG. 4A), and (ii) confine interference light formed by light reflected between the first reflector region 406 and the second reflector region 414.

A portion of the light generated in the light source region 430 may be coupled to the interference region 410 through spontaneous emission or any other appropriate coupling mechanism. Light coupled to the interference region 410 may resonate along the x direction, as designated by the arrow 434. Similar to the operations described in FIG. 1A, the first reflector region 406 and the second reflector region 414 provide reflective surfaces that forms a cavity in the interference region 410, where a standing wave pattern may be formed. Since the interference region 410 has a fixed cavity length $L_{Cavity}$, the standing wave pattern can only be formed by certain wavelengths, and the interference region 410 may therefore act as a wavelength filter. In some implementations, incoherent light generated by the light source region 430 may be transformed into coherent light in the interference region 410 by filtering out wavelengths that do not resonate in the interference region 410.

The grating region 420 includes a grating 418 formed on a region confining at least a portion of the interference light. The grating 418 is configured to emit a portion of the light at the z direction that is substantially perpendicular to the x direction. In some implementations, the grating 418 may be designed and fabricated in the grating region 420 to substantially match the standing wave pattern in the interference region 410. By matching the standing wave pattern, the grating 418 may act as an optical antenna and become the most efficient way for light to leave the interference region 410. Each grating structure may act to emit the light as a point wave, and all point-wave fronts emitted from individual grating structures are combined into a planar wave front which propagates in the z direction with low loss.

Figure 4B:
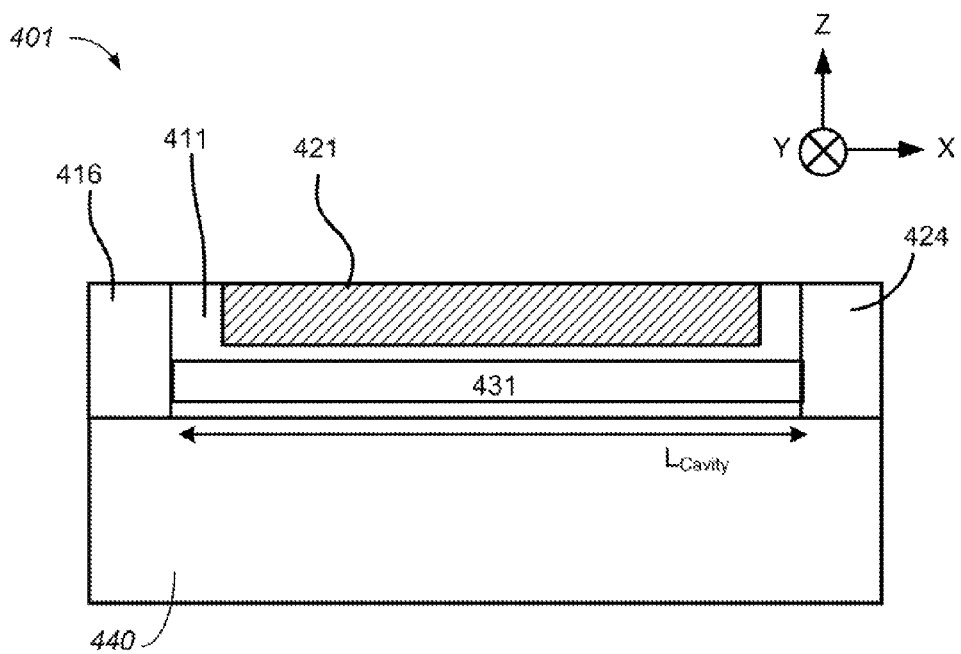

FIG. 4B shows an example photonic integrated circuit 401 having a grating based optical coupler where a light source region 431 is coupled to the interference region 411 by being embedded in the interference region 411. The light source region includes active material layers such as alternating layers of gallium arsenide (GaAs) and aluminum gallium arsenide (GaAlAs) or alternating layers of InGaAs and InP. Any other combinations of active material layers forming a quantum dot, wire, and well structures that produce incoherent or coherent light are also within the scope of this disclosure.

The interference region 411 is formed between the first reflector region 416 and the second reflector region 424. The first reflector region 416 and the second reflector region 424 may be formed, for example, by coating a metal layer or dielectric layers on the end facets or by forming a DBR structure.

Compared to the descriptions of FIG. 4A where the light is generated outside the interference region 410, in FIG. 4B, the light is generated inside the interference region 411. The generated light resonates along the x direction between the first reflector region 416 and the second reflector region 424 in the interference region 411 to generate coherent light and form a standing wave pattern. The grating region 421 may be designed to substantially match the standing wave pattern, where the coherent light is emitted out of the photonic integrated circuit 401 through the grating region 421 along the z direction. In some implementations, the substrate 440 may be used as a supporting layer. In some implementations, the substrate 440 may include a DBR structure to further reduce the light that propagates in the −z direction.

Figure 4C:
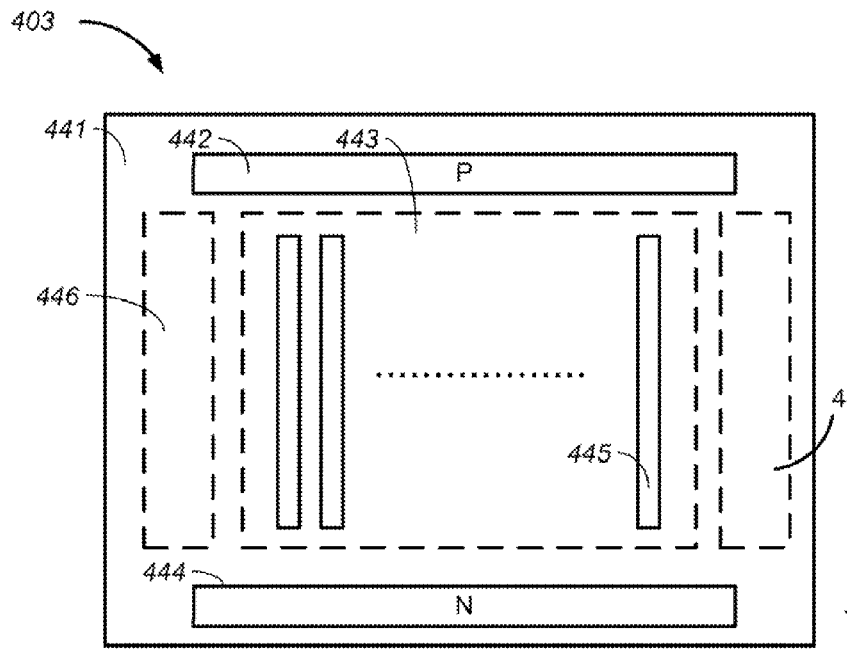

FIG. 4C shows an example photonic integrated circuit 403 having a grating based optical coupler integrated with a light source, where the interference light can be controlled by a p-n junction. The photonic integrated circuit 403 includes a light source region 441, a p-doped region 442, an interference region 443, an n-doped region 444, a grating region 445, a first reflector region 446, and a second reflector region 448. The structures of the light source region 441, the p-doped region 442, the interference region 443, the n-doped region 444, the grating region 445, the first reflector region 446, and the second reflector region 448 may be implemented by any corresponding structures described throughout this application, for example, the corresponding structures in FIGS. 1A-3E.

Similar to the descriptions of FIG. 4A, incoherent light is generated in the light source region 441, where a portion of the light is coupled to the interference region 443. The coupled light resonates along the x direction between the first reflector region 446 and the second reflector region 448 in the interference region 443 to form a standing wave pattern and generate coherent light. A grating in the grating region 445 is designed to substantially match the standing wave pattern, and the coherent light may be emitted out of the photonic integrated circuit 403 through the grating 443 in the +z or −z direction, depending on the design of the grating 445.

In some implementations, the n-doped region 444 and a p-doped region 442 may be configured to provide an electric field in the interference region 443 with an application of a voltage or a current across the n-doped region 444 and the p-doped region 442. The interference region 443 may be configured to provide a different interference pattern with the application of a voltage or a current across the n-doped region 444 and the p-doped region 442 due to the generation, recombination, injection or depletion of free carriers. In the case where the interference pattern is changed due to the change of refractive index, the interference region 443 may stop lasing or may support another lasing wavelength. Therefore the application of a voltage or a current across the n-doped region 444 and the p-doped region 442 can act as a tunable wavelength lasing mechanism or a modulation to the coherent light.

Figure 4D:
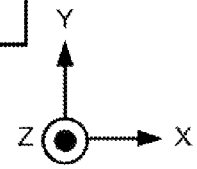

FIG. 4D shows an example photonic integrated circuit 405 having a light source region coupled to an interference region through a waveguide region where a grating based optical coupler is configured to emit the generated light. The photonic integrated circuit 405 includes a light source region 450, a waveguide region 451, a first reflector region 452, a second reflector region 453, an interference region 454, and a grating region 455. The structures of the light source region 450, the waveguide region 451, the first reflector region 452, the second reflector region 453, the interference region 454, and the grating region 455 may be implemented by any corresponding structures described throughout this application, for example, the corresponding structures in FIGS. 1A-3E.

Here, incoherent light is generated in the light source region 450, where a portion of the light is coupled to the waveguide region 451. For example, the light source region 450 may include an indium gallium arsenide (InGaAs) quantum well (QW) or quantum dot (QD) structure bonded to a silicon waveguide, where the light generated by the QW is coupled to the silicon waveguide. The coupled light resonates between the first reflector region 452 and the second reflector region 453 in the interference region 454 to generate coherent light and form a standing wave pattern. For example, the waveguide structures of the first reflector region 452 and the second reflector region 453 may be designed to support a single mode propagation, which may filter out higher order modes in the interference region 454. A grating in the grating region 455 is designed to substantially match the standing wave pattern, and the coherent light is emitted out of the photonic integrated circuit 405 through the grating region 455 along a direction that is substantially perpendicular to the resonating direction of the light generated by the light source region 450. In some implementations, taper regions are used in the interference region to bridge a wider grating region and a narrower waveguide region. The narrow waveguide region may be used to suppress high order mode and the wide grating region may be used to match the external coupling device with different beam shapes, areas and numerical aperture requirement. The descriptions of the taper regions may be applied to any one of the optical couplers described in this application.

Figure 4E:
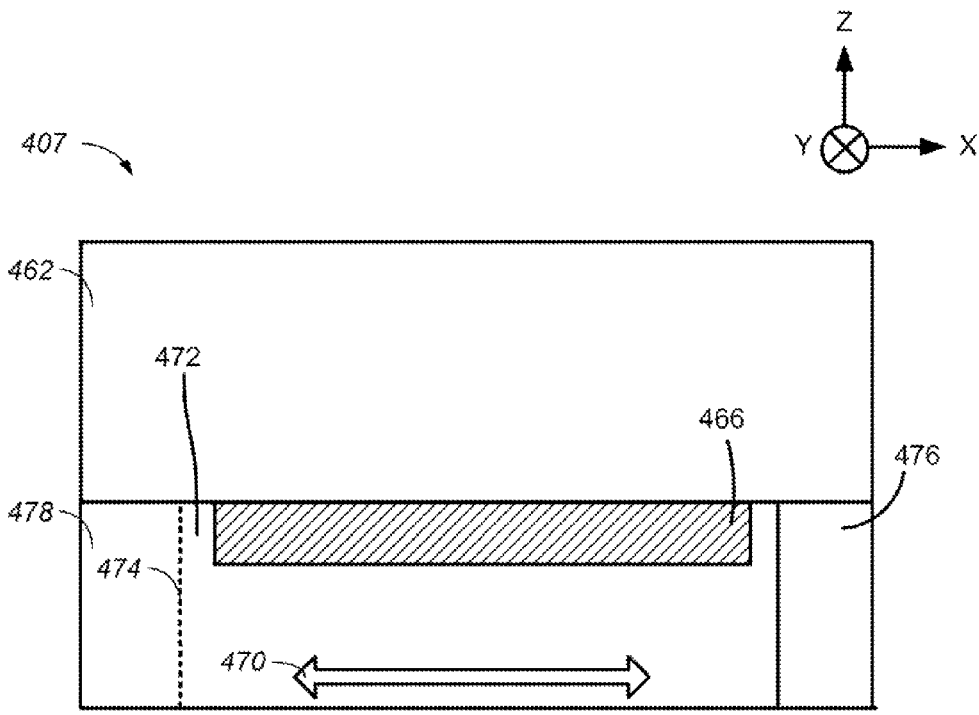

FIG. 4E shows an example photonic integrated circuit 407 having a light source region coupled to a grating based optical coupler through the grating region 466. The photonic integrated circuit 407 includes a light source region 462, a first reflector region 478, a second reflector region 476, an interference region 472, a boundary 474, and a grating region 466. The structures of the light source region 462, the first reflector region 478, the second reflector region 476, the interference region 472, and the grating region 466 may be implemented by any corresponding structures described throughout this application, for example, the corresponding structures in FIGS. 1A-3E.

Here, incoherent light is generated in the light source region 462 and coupled to the interference region 472 through spontaneous emission or another suitable coupling mechanism. The coupled incoherent light is reflected by the reflector regions 476 and 478, and resonates along the x direction. The coherent light, when reaching lasing threshold, can emit either in the +z or −z direction depending on the design of the grating region 466. In some implementations, the grating region 466 can be designed to direct light mostly to the −z direction so that the emitted light does not couple back to the light source region 462.

In some implementations, the reflector 478 can be a partial reflector with less reflectivity than the reflector 476. The incoherent light generated in the light source region 462 can couple to the interference region 472 through spontaneous emission, and resonates along the direction 470. When reaching the lasing threshold, the coherent light can propagate in the −x direction through the boundary 474 into the partial reflector 478 and then into a waveguide, and at the same time propagate in the +z or −z direction into an external medium for further processing.

Figure 4F:
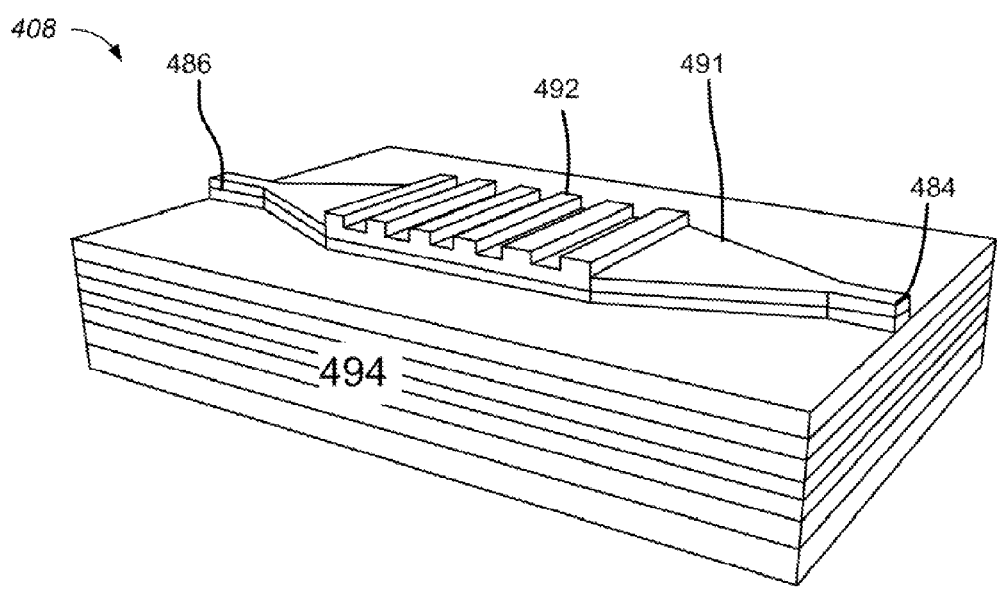

FIG. 4F shows an example of the photonic circuit 408 having similar layer stacks as FIG. 4B. The interference region 491 is composed of active materials such as III-V semiconductors to generate incoherent light. The incoherent light resonates between the first reflector 486 and the second reflector 484 along the x direction and becomes coherent. The coherent light is emitted through the grating 492 upward since the DBR structure 494 is used to reduce the light that propagates in the downward direction.

For a conventional laser diode, the basic functioning principle is by supplying electrical carriers from two terminals (P and N) or electrodes into a light source region including at least one photon emitting materials (PEM) such as III-V semiconductors to be as a gain material. The terminals are usually forward-biased to let electrons and holes meet in the PEM, recombine and emit photons. As shown previously in FIG. 1A, the first reflector 106 and the second reflector 114 define the resonance structure (namely, the interference region or cavity 110), which extends along a lateral direction while the re-directed light is emitted along a vertical direction 123. When the interference region 110 contains PEM layer and two terminals are provided such that photons can be generated in the interference region 110, these photons can resonate between two reflectors 106 and 114 along a lateral direction. In this disclosure, a third type of terminal, functioning as a gate terminal (the conventional two terminals can be viewed as the "conducting terminals"), is included to attract/repel/inject/retrieve certain type of the carriers toward the gate region, hence modulating the amount of carriers to be recombined. The electrical contact of this terminal can be of many forms, such as a direct metal contact (ex: MESFET type), a junction type (ex: JFET type), or through a dielectric for field control (MOSFET type). While there are many possible implementations for this control terminal, the core concept is to provide a second set of electrical field to alter the amount of carriers recombined in addition to the first set of electrical field that is used to inject carriers to generate photons. Such "gate controlling" scheme can be faster than the conventional direct modulation to a laser diode and it can also enable multiple modulation schemes by encoding more than 1 bit of data (on/off) with multiple levels of applied voltages/currents to the gate to result in different power levels of output light. This type of modulation is similar to amplitude modulation, which is by applying different voltage levels to the gate. Various exemplary embodiments for realizing this gate-controllable lateral resonance optical emitter structure are described in more details in the following paragraphs.

Figure 5A:
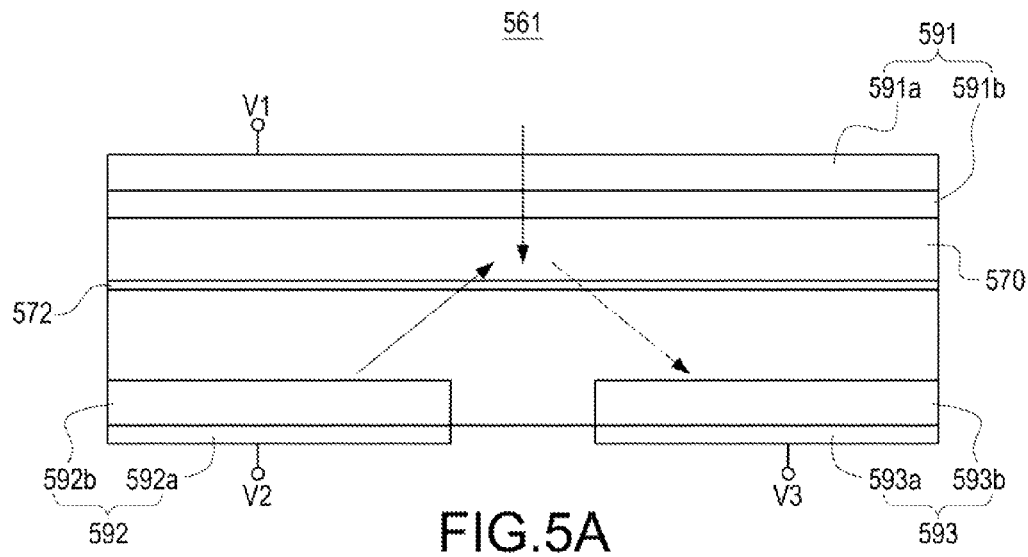
FIGS. 5A-5K show block diagrams of a grating-based laser device.

FIG. 5A shows the cross-sectional view of an exemplary optical apparatus 561 for light emission. The optical apparatus 561 for light emission comprises a light source region 570, which includes a photon emitting materials (PEM) layer 572. Moreover, the light source region 570 can be an interference region bounded by two reflectors. The optical apparatus 561 further comprises a first electrode 591 coupled to the light source region 570, a second electrode 592 coupled to the light source region 570, and a third electrode 593 coupled to the light source region 570. As also shown in this figure, the first electrode 591 comprises a conducting layer 591a and a doped region 591b. The conducting layer 591a is, for example, a metal layer, and the doped region 591b is, for example, an n type doped region. Similarly, the second electrode 592 comprises a conducting layer 592a and a doped region 592b. The conducting layer 592a is, for example, a metal layer, and the doped region 592b is, for example, a p type doped region. Namely, the first electrode 591 and the second electrode 592 are of different polarities such that carriers (electrons and holes) can be injected into the light source region 570. For example, electrons are injected into the PEM layer 572 through the n type doped region 591b and holes are injected into the PEM layer 572 through the p type doped region 592b such that electrons and holes are combined in the PEM 572 to generate photons. The third electrode 593 comprises a conducting layer 593a and an insulating layer 593b wherein the insulating layer 593b is between the conducting layer 593a and the light source region 570. In some implementations, the conducting layer 593a includes doped polysilicon or metal and the insulating layer 593b includes oxide or nitride or semi-insulating III-V semiconductors. As shown in this figure, a voltage V1 is applied to the first electrode 591, a voltage V2 is applied to the second electrode 592 and a third voltage V3 is applied to the third electrode 593, where V2>V1. In some implementations, the electrode with the lowest voltage can be used as ground. In some implementations, if V3>V2, then the third electrode 593 attracts electrons (shown by dashed line) and reduces the amount of electrons to recombine with holes from the second electrode 592. In some implementations, if V2>V3>V1, then the third electrode 593 attracts both holes from the second electrode 592 and electrons from the first electrode 591. In some implementations, if V3<V1, then the third electrode 593 attracts holes from the second electrode 592. In some implementations, if V3 is intended to be larger than V2, then the third electrode 593 could be P-type; and if V3 is intended to be smaller than V1, then the third electrode 593 could be N-type.

Note that other similar structures wherein a third electrode other than the conventional two conducting electrodes are also possible and should be included in this disclosure as long as it follows the key concept. Some more examples are shown in the block diagrams included in FIGS. 5B-5G. Typically, the optical apparatus for light emission according to one implementation comprises a third electrode modulating the amount of electrical carriers for recombination, and a lateral optical cavity structure for light resonance, which are shown by the examples before.

Figure 5B:
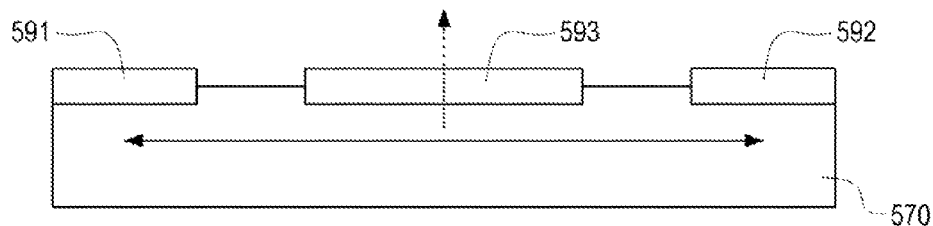
Figure 5C:
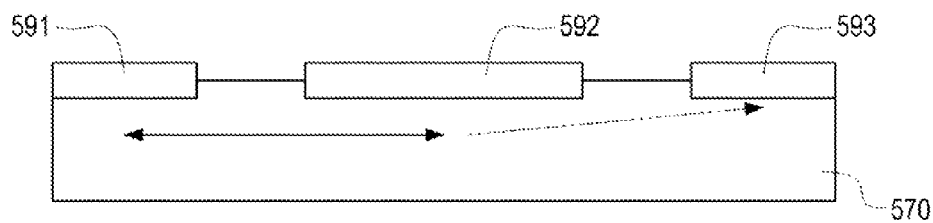
Figure 5D:
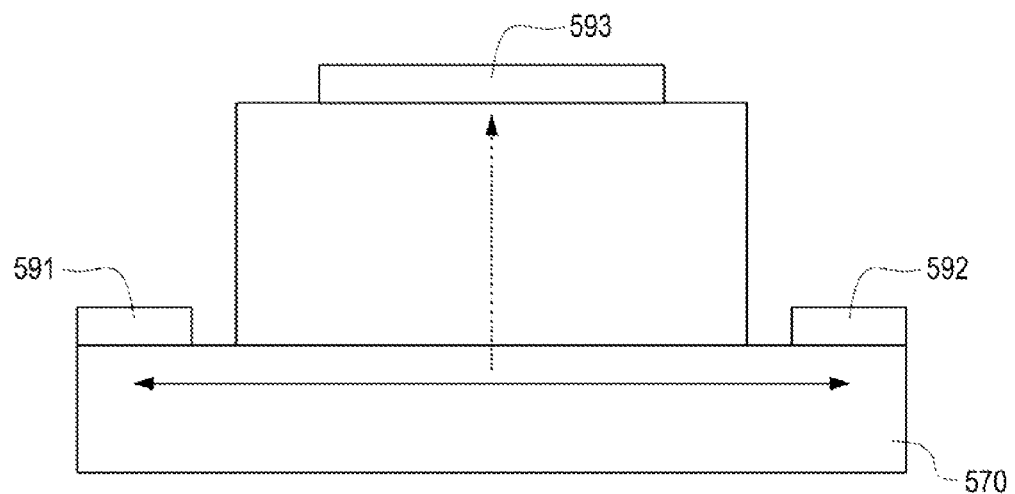
Figure 5E:
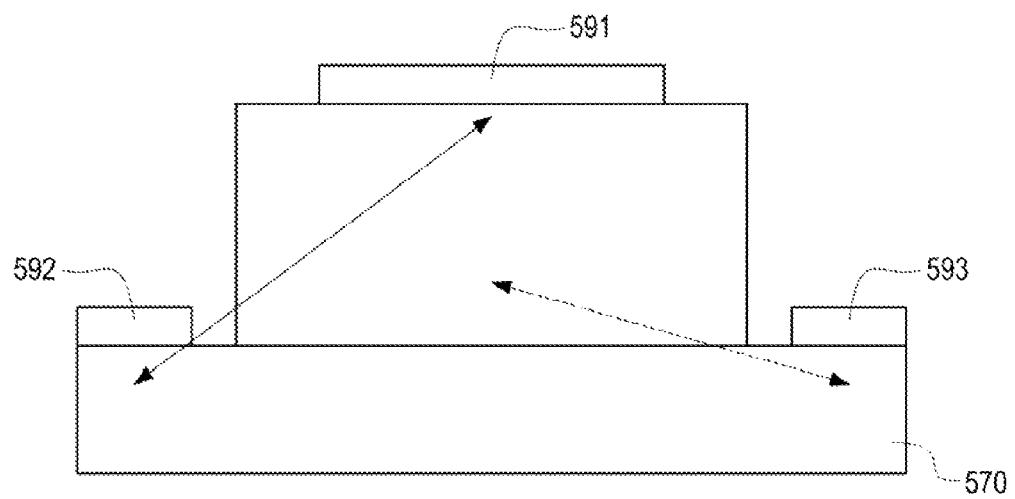

FIGS. 5B-5E show the block diagrams of the optical apparatus for light emission with lateral cavity. In these examples, we use V1 and V2 as the voltages applied to the "conducting" electrodes (namely, the first electrode 591 and the second electrode 592) of the laser, and V3 as the voltage applied to the "modulating" electrode (namely the third electrode) to control the amount of carriers recombined to emit photons. The P or N type is omitted here in the description to be more generic. The solid-line with two arrows indicating the region where recombination takes place, and is usually inside III-V semiconductors, III-V semiconductor based quantum well structure, III-V semiconductor based quantum dot structure, or other materials with direct bandgap. As shown in FIG. 5B, the first and the second electrode 591 and 592 are located at two opposite sides of the interference region 570. The photon emitting materials (PEM) is omitted here in the description and can be viewed as being partially embedded inside the interference region 570. The third electrode 593 is located between the first and the second electrode 591 and 592 to modulate the carries between the first electrode 591 and the second electrode 592. As shown in FIG. 5C is another implementations while the third electrode 593 is located outside the connection path of the first and the second electrode 591 and 592. In this scenario, the third electrode 593 might still perform modulation function by drawing carrier from the carrier-recombination region. In the examples shown in FIGS. 5B and 5C, the electrodes are located on similar levels. In the example shown in FIGS. 5D and 5E, at least one of the electrodes is located on different layer with other electrodes. Similar to the example shown in FIG. 5A, the first electrode 591 comprises a conducting layer and a doped region. Namely, the first electrode 591 and the second electrode 592 are of different polarities such that carriers (electrons and holes) can be injected into the light source region. The third electrode 593 comprises a conducting layer and an insulating layer wherein the insulating layer is between the conducting layer and the interference region 570. Moreover, in the examples shown in FIGS. 5B to 5E, light reflectors (not shown) are arranged on two opposite faces of the interference region 570 and corresponds to the arrow directions of the solid-line region in FIG. 5D. After applying electrical current or voltage between the first and the second electrode 591 and 592, photons can be generated and resonate along the solid-line region and bounded by the light reflectors in FIG. 5D. An electrical voltage or current can be applied to the third electrode 593 to attract or repel carries (shown by dashed line) and hence changing the amount of electrons or holes to recombine in the interference region, thus realizing the modulation function. Compared to FIG. 5D, FIG. 5E shows another implementation by switching the positions of one conducting electrode and one modulating electrode. The injection path (solid line) and modulating path (dashed line) are changed accordingly.

Figure 5F:
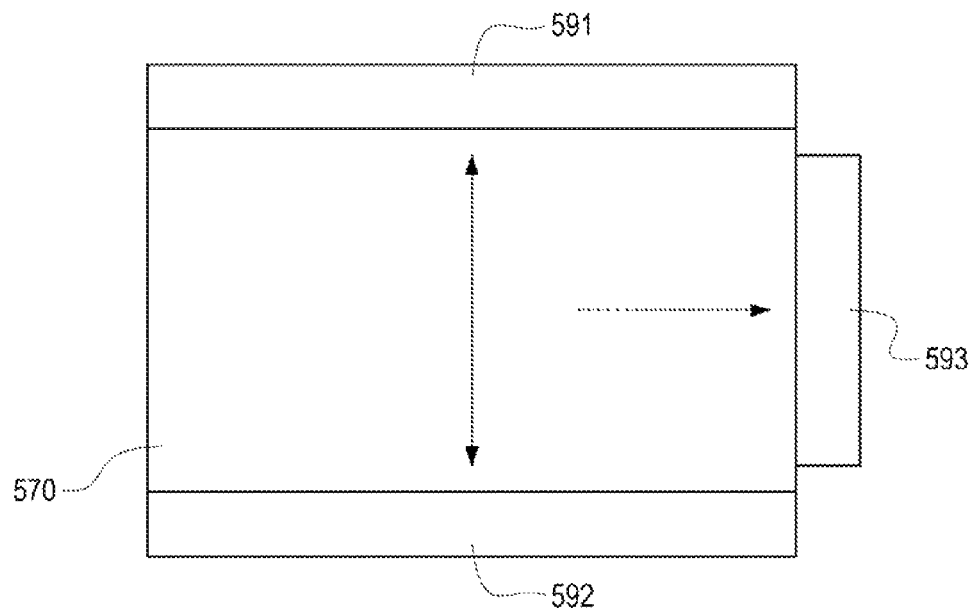
Figure 5G:
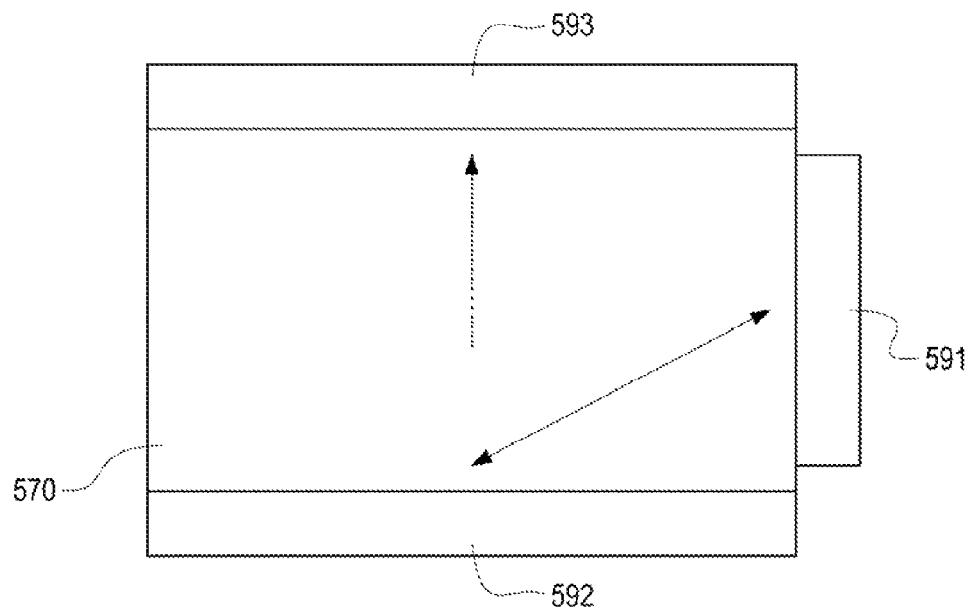
Figure 5H:
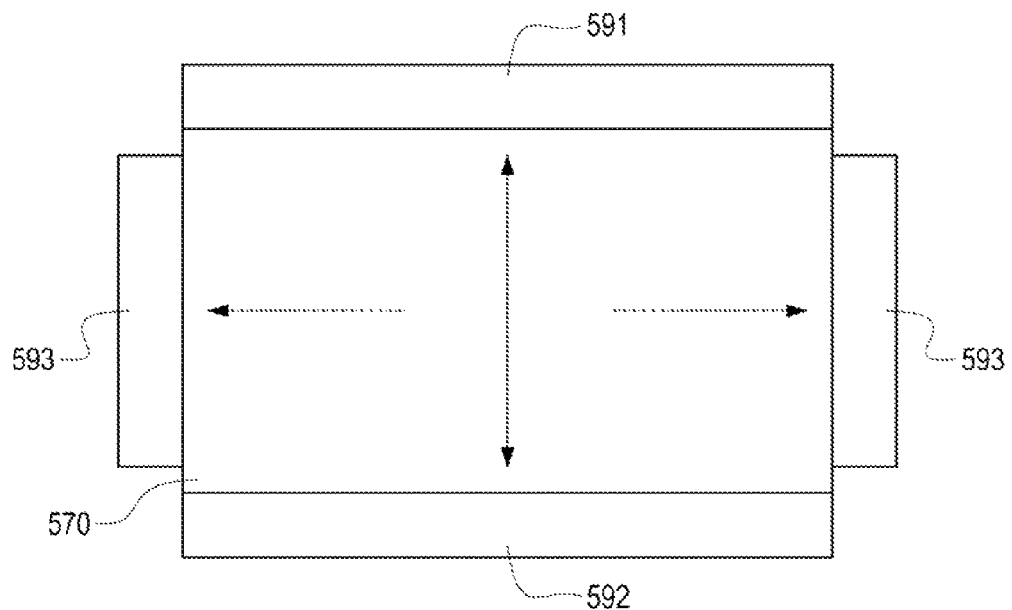
Figure 5I:
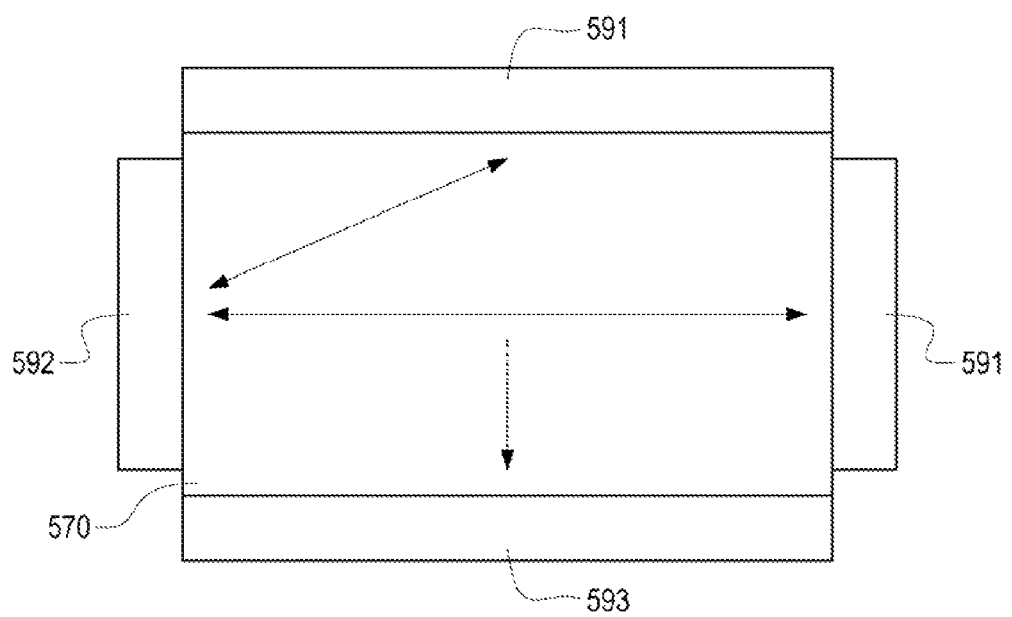
Figure 5J:
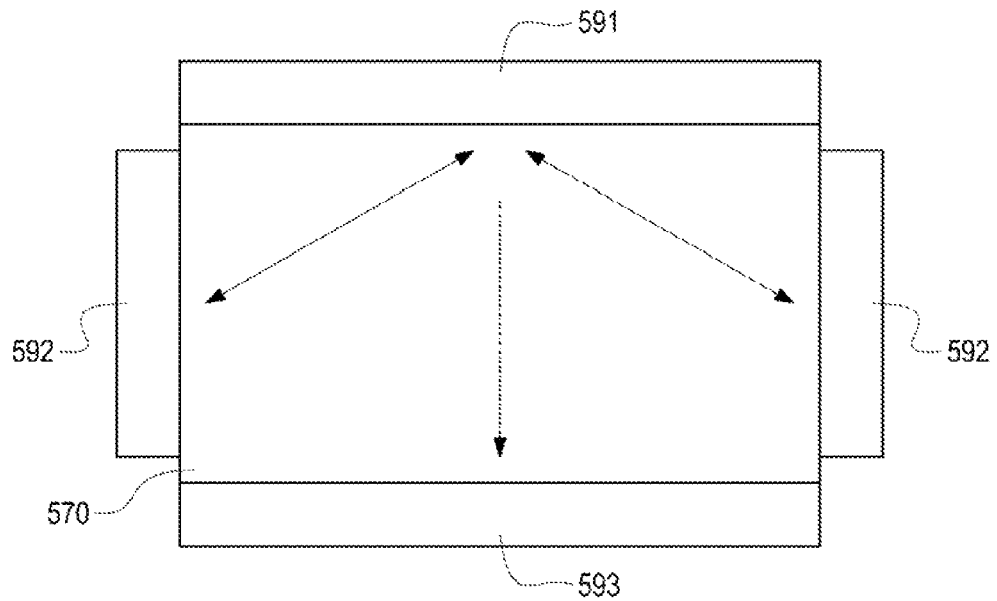
Figure 5K:
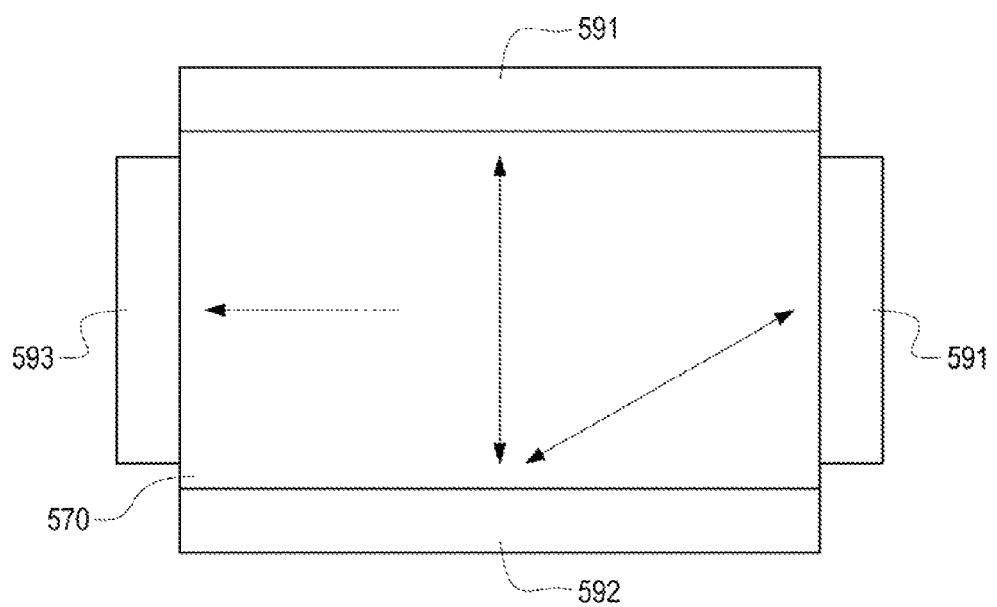

FIGS. 5F-5K show the block diagrams of optical apparatus for light emission with several other implementations electrode orientations similar to the numbering and notations used in FIGS. 5A-5E. FIG. 5F shows an implementation with vertically oriented conducting electrodes 591 and 592 and a sidewall modulating electrode 593. FIG. 5G shows sidewall conducting electrodes 591 and 592 with a top modulating electrode 593. FIG. 5H shows the implementation similar to FIG. 5F but with more than one modulating electrode 593. FIG. 5I shows two conducting paths (the solid lines) and a vertical modulating electrode 593 at the bottom. FIG. 5J shows two conducting paths (the solid lines) and a vertical modulating electrode 593 at the bottom. FIG. 5J shows two conducting paths (the solid lines) and a modulating electrode 593 at the sidewall.

Since all the major elements shown in the examples can be combined to form other designs or implementations, such as the relative orientations of the quantum well or quantum dot structures of the PEM to the cavity (for example, in parallel or vertical to the resonance region), the size and position of the taper regions (such as the element 454 in FIG. 4D), the grating form, using two conventional conducting electrodes or including an additional modulating electrode, these figures shown here are just a few examples within many possible implementations of this disclosure. Therefore, any design/structure following the concept of this disclosure should still be considered as within the scope of this disclosure. Also, different electrodes and contacts can locate at different layers either in a lateral or vertical orientation. Note that the figures shown as design examples are not drawn to scale for simplified viewing purpose. Also, the interference region (cavity) can include PEM such as GaAs, InGaAsP, InP, InGaAs, silicon nanocrystal, germanium nanocrystal, or other materials as long as the PEM layers can be added on top or least partially embedded in the interference region through bonding or material growth. Furthermore, more than one cavity can be cascaded along the resonance direction for a wider operation bandwidth. Therefore, any implementation following the concept set forth by the claims should be considered as within the scope of this disclosure.

Figure 6A:
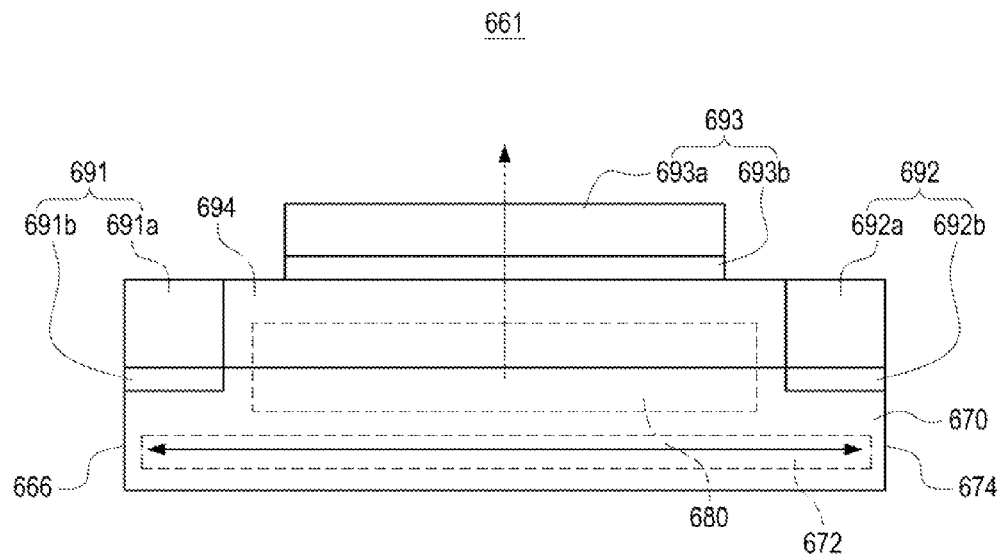
FIGS. 6A-6G show examples of a grating-based laser device with front-side modulation.

FIG. 6A shows the cross-sectional view of an exemplary grating based laser device (hereinafter laser device) 661 with front-side modulation, wherein front-side modulation means that the modulation gate is at the side with light emission. The laser device 661 includes active material layers such as alternating layers of gallium arsenide (GaAs) and aluminum gallium arsenide (GaAlAs) or alternating layers of InGaAsP and InP as photon emitting material (PEM) 672, which is optically coupled to the interference region 670. Any other combinations of active material layers forming a quantum dot, wire, and well structures that produce incoherent or coherent light are also within the scope of this disclosure. The laser device 661 includes an interference region (cavity) 670 bounded by a first reflector 666 and a second reflector 674. In the shown example, the laser device 661 further includes a grating region 680 formed in an upper portion of the interference region 670. The laser device 661 further includes a first contact 691, a second contact 692 and a third contact 693, where the first contact 691 and the second contact 692 are placed at two ends of the interference region 670 while the third contact 693 is placed atop the interference region 670 and between the first contact 691 and the second contact 692. The first electrode 691 comprises a conducting layer 691a and a doped region 691b. The conducting layer 691a is, for example, a metal layer, and the doped region 691b is, for example, an n type doped region. Similarly, the second electrode 692 comprises a conducting layer 692a and a doped region 692b. The conducting layer 692a is, for example, a metal layer, and the doped region 692b is, for example, a p type doped region. Namely, the first electrode 691 and the second electrode 692 can be of different polarities such that carriers (electrons and holes) can be injected into the interference region 670 and recombined in the PEM 672. For example, electrons are injected through the n type doped region 691b and holes are injected through the p type doped region 692b such that electrons and holes are recombined to generate photons. The third electrode 693 comprises a conducting layer 693a and an insulating layer 693b wherein the insulating layer 693b is formed between the conducting layer 693a and the light source region 670. Moreover, the conducting layer 693a includes doped poly-silicon or metal and the insulating layer 693b includes oxide or nitride or other semi-insulating III-V semiconductors. In some implementations, the interference region includes electrical conducting materials such that the carriers injected from the contacts can be transferred into the PEM region for recombination to generate photons.

Taking N type as an example for the first contact (electrode) 691 and P type as an example for the second contact 692, electrons will be injected at N type contact 691 and holes will be injected at P type contact 692 as voltages V1 and V2 (V2>V1) are applied to the first contact 691 and the second contact 692, respectively. Accordingly, photons are generated at the active material layers 672 when the electrons are recombined with the holes. If a voltage V3 applied to the third contact 693 is larger than V2, the third contact 693 will attract electrons (as shown by dashed line) and reduce the amount of electrons to recombine with holes from P type contact 692. If V2>V3>V1, the third contact 693 will attract both electrons and holes from the N type contact 691 and the P type contact 692, respectively. If V3<V1, the third contact 693 will attract holes from the P type contact 692. In this manner, the third contact 693 is used for carrier modulation for the laser device 661. The third contact 693 may be separated with the interference region 670 by a medium 694 to adjust the electrical field penetrating into the interference region. The medium 694 can be omitted if a direct carrier modulation mechanism such as PN (junction type) or MS (direct metal contact type) modulation is applied. In the laser device 661 shown in FIG. 6A, carriers (electrons or holes) are injected into the PEM region 672 which is optically and electrically coupled to the interference region 670 when suitable voltages are applied to the first contact 691 and the second contact 692, respectively.

The structures of the first reflector 666, the second reflector 674, the interference region 670, and the grating region 680 may be implemented by any corresponding structures described throughout this application, for example, the corresponding structures in FIGS. 1A-3E. In some implementations, the interference region 670 is composed of III-V semiconductors, and at least one of the first reflector 666 and second reflector 674 includes a corner mirror, a DBR mirror, a dispersive mirror, a waveguide loop mirror, or a metal layer. The generated light resonates along the direction between the first reflector 666 and the second reflector 674 in the interference region 670 to generate coherent light and form a standing wave pattern. The grating region 680 may be designed to substantially match the standing wave pattern, where the coherent light is emitted out of the laser device 661 through the grating region 680 along a direction different from the resonance direction. In some implementations, the grating has lattice vectors formed so that the locations of the in-phase antinodes of the light inside the interference region 670 substantially match the locations of the grating valleys or peaks. In some implementations, the third contact 693 is a transparent material (such as ITO) to pass the re-directed coherent light.

Figure 6B:
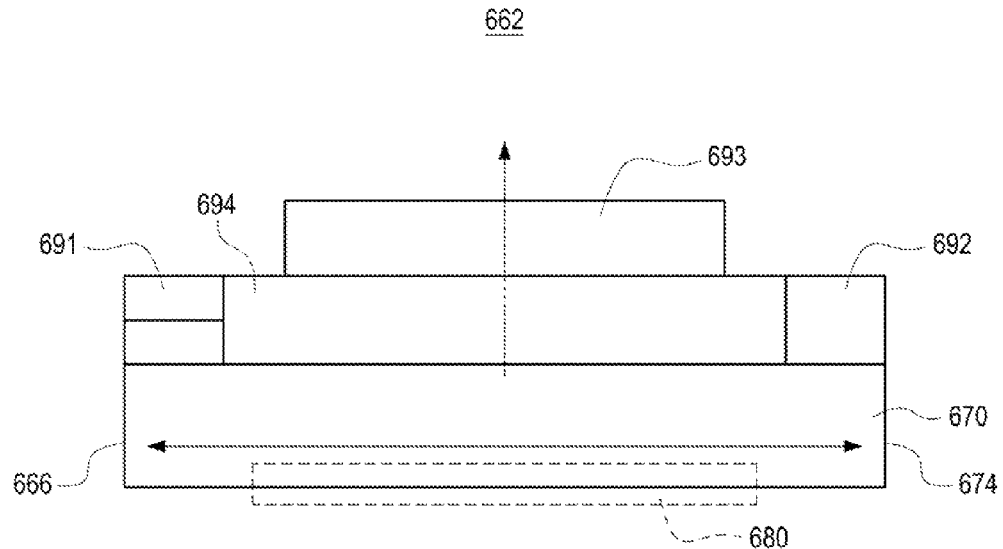

FIG. 6B shows the cross-sectional view of an exemplary grating based laser device (hereinafter laser device) 662 with front-side modulation. The laser device 662 is similar to that shown in FIG. 6A except that the grating region 680 is located on the bottom portion of the interference region 670. In FIG. 6B, elements similar to those of FIG. 6A use the same numerals for brevity, and these elements also have the same or similar materials/composition/function as those shown in FIG. 6A Moreover, in the laser device 662 shown in FIG. 6B, the first contact 691 and the second contact 692 are in contact with different epitaxy grown layers such that the first contact 691 and the second contact 692 are located at different vertical layers. In some implementations, the first electrode 691 is in contact to an N type III-V semiconductor, the second electrode 692 is in contact to a P type III-V semiconductor wherein the N type and P type materials are both grown by MOCVD or MBE with in-situ doping.

Figure 6C:
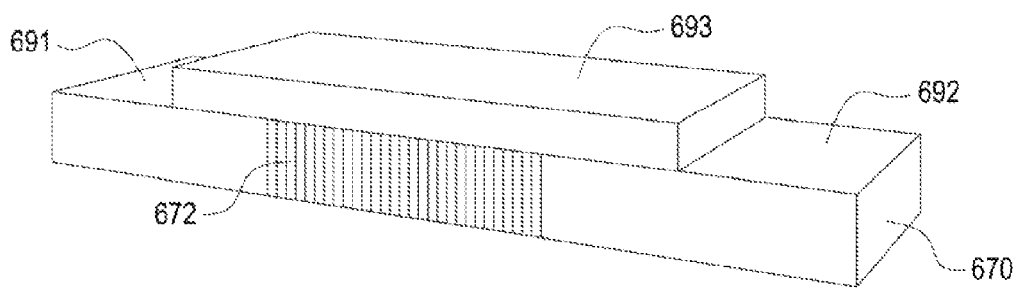
Figure 6D:
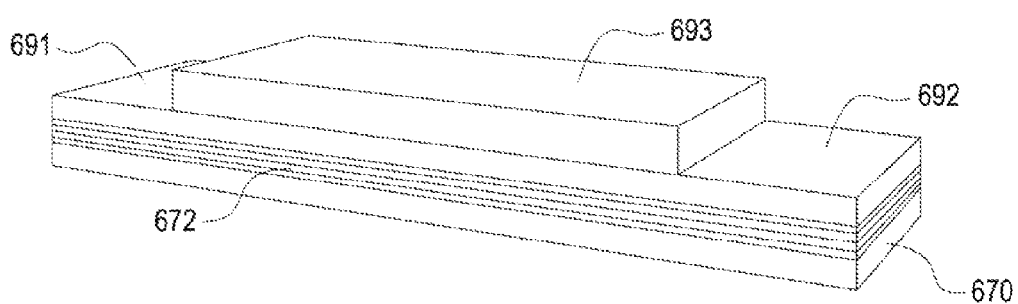

FIGS. 6C and 6D show the perspective views of exemplary grating-based laser devices (hereinafter laser device) 663 and 664 with front-side modulation. The laser devices 663 and 664 are similar to that shown in FIG. 6A except that the arrangement of quantum wells structure inside the PEM 672 can be in parallel (FIG. 6D) or vertical (FIG. 6C) to the carrier injection direction or to the resonation direction. Since in FIGS. 6C and 6D, light passes one of the electrodes (V3), the material for this electrode should be transparent to light. For example, if the third electrode 693 is overlapping with the light emitting path, an insulting material such as oxide and a conducting material such as poly silicon can be used when the output light wavelength is longer than 850 nm.

Figure 6E:
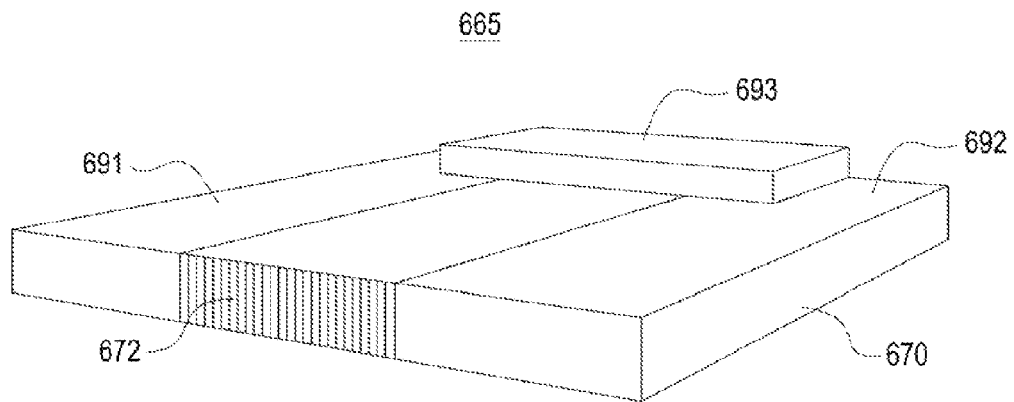
Figure 6F:
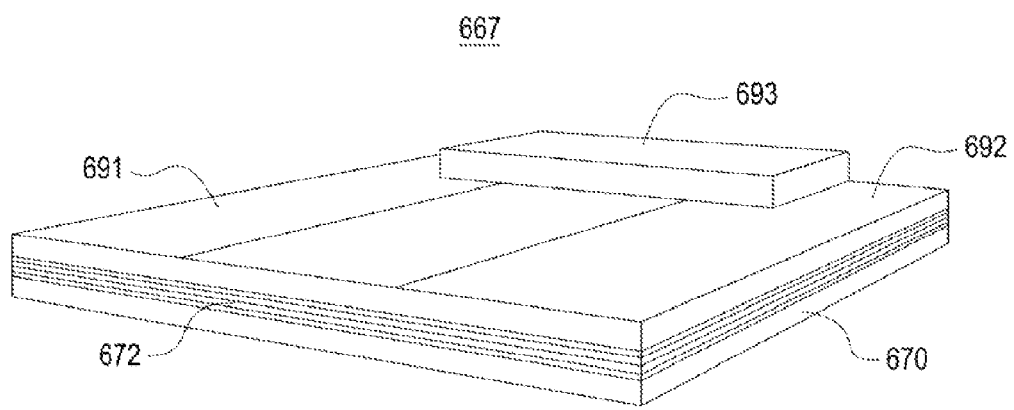

FIGS. 6E and 6F show the perspective views of exemplary grating-based laser devices (hereinafter laser device) 665 and 667 with front-side modulation. The laser device 665 shown in FIG. 6E has similar quantum well orientations to that shown in FIG. 6C, and the laser device 667 shown in FIG. 6F has similar quantum well orientations to that shown in FIG. 6D except that one of the terminal (for example, the third electrode 693) is intentionally offset from the light emitting direction to avoid blocking the light. The choice of materials for this terminal can be more diversified compared to those shown in FIGS. 6C and 6D.

Figure 6G:
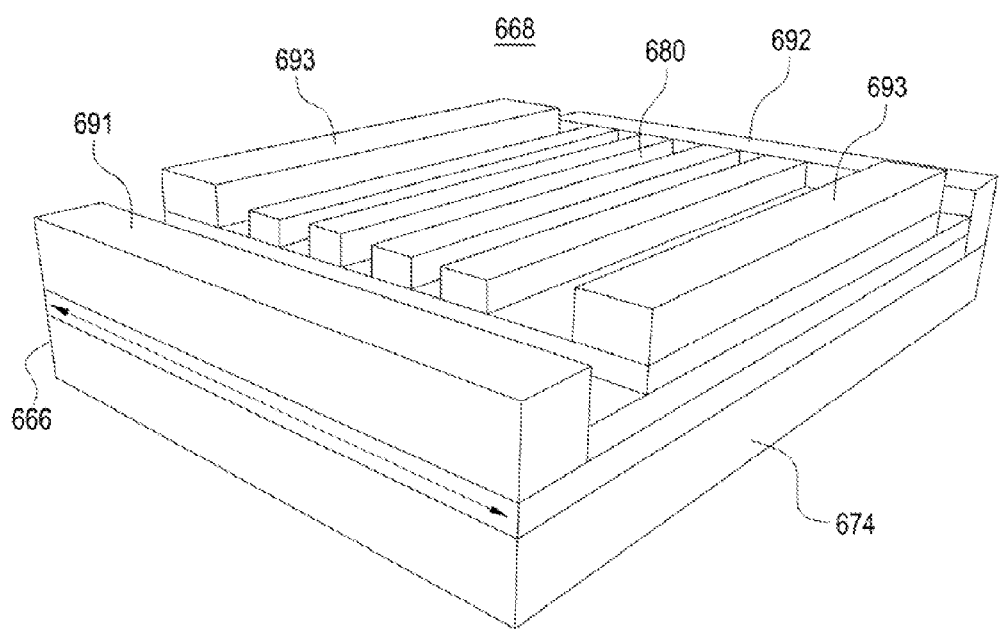

FIG. 6G shows the perspective view of an exemplary grating-based laser device (hereinafter laser device) 668 with front-side modulation. The shown laser device 668 is similar to that of FIG. 6A except that two conducting electrodes 691 and 692 are contacting to different layers and the carrier injection direction (between 691 and 692) is different from the light resonance direction (between two electrodes 693) bounded by a first reflector 666 and a second reflector 674. In this example, the carriers are primarily injected from 691 and 692, and recombined to generate photons. The photons can resonate between two reflectors 666 and 674 and emit through the grating region 680 in a mechanism similar to what has been described before. The modulating electrodes 693 are located away from the grating emission area to avoid blocking the light. In some implementations, the grating region 680 can also function partially as part of the modulating electrode.

Figure 7A:
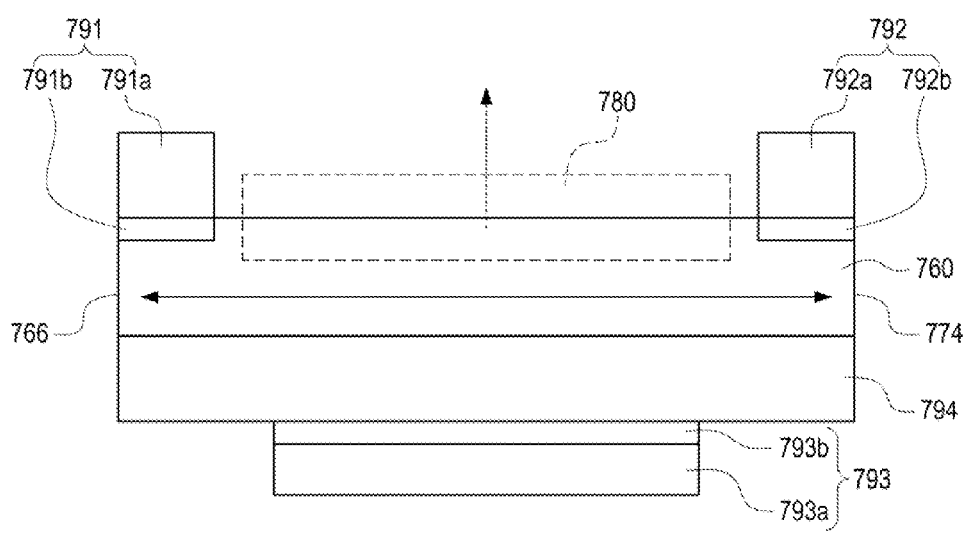
FIGS. 7A-7C show examples of a grating-based laser device with back-side modulation

FIG. 7A shows the cross-sectional view of an exemplary grating-based laser (hereinafter laser device) 761 with backside modulation. The laser device 761 is similar to that of FIG. 6A except that the third contact 693 is formed on the bottom (back side) of the interference region 760 and the coherent light is emitted from the top (front side) of the interference region 760 through the grating region 780 in a mechanism similar to what has been described before. Although not shown in this figure, the first contact 791 and the second contact 792 may also be in contact with different epitaxy grown layers in a way similar to FIG. 6B. Moreover, the grating region 780 can also be located on the bottom of the interference region 760 in a way similar to FIG. 6B as long as the directionality is designed accordingly. For a back-side modulation with front-side emission structure as shown here, the material composition of the modulating electrode can be more flexible since it is not overlapping with the light emission path.

Figure 7B:
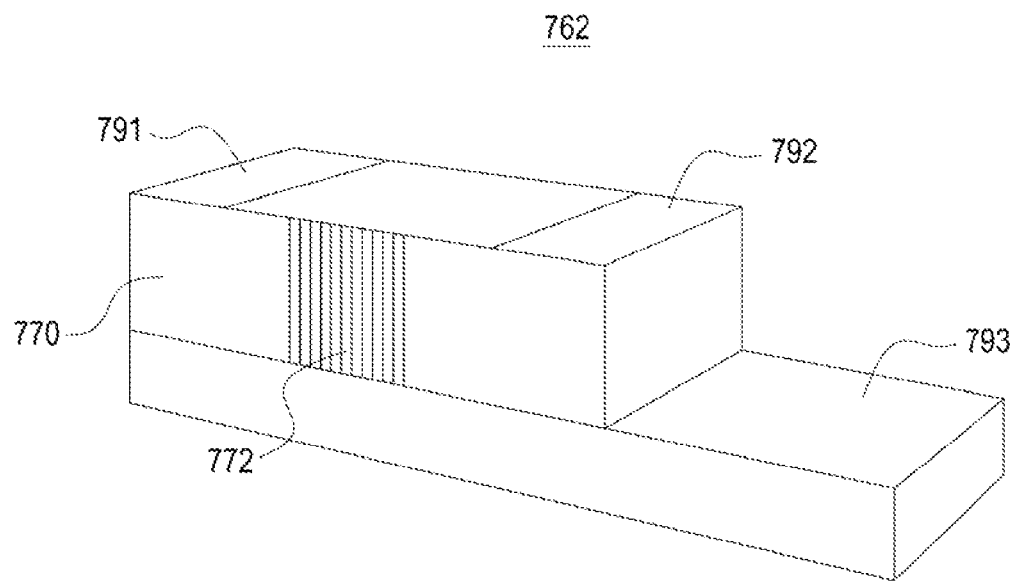
Figure 7C:
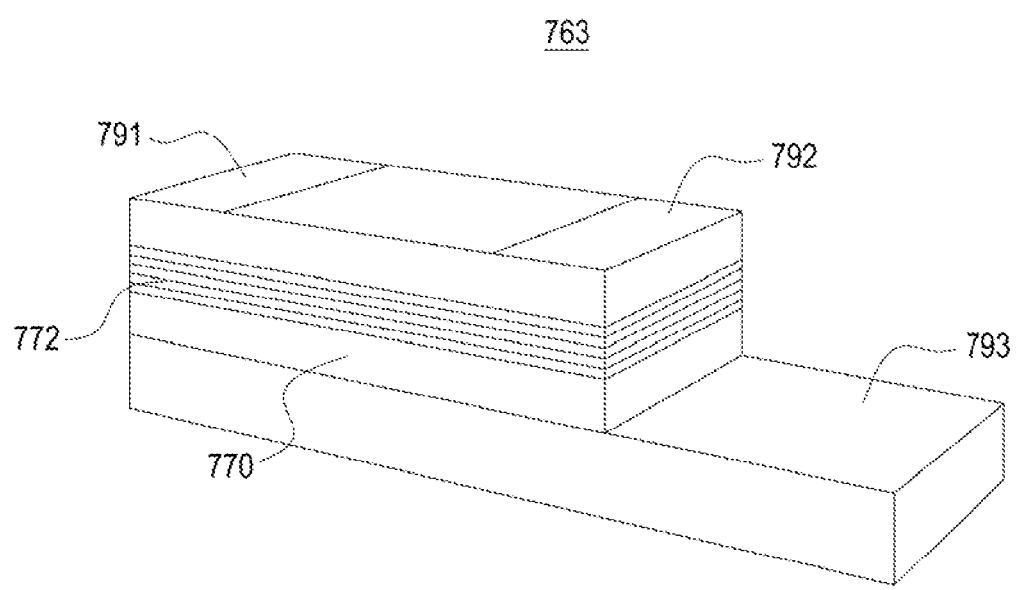

FIGS. 7B and 7C show the perspective views of the exemplary grating-based lasers (hereinafter laser devices) 762 and 763 with back-side modulation. The laser devices shown here are similar to that of FIGS. 6E and 6F in that the quantum well orientations inside the PEM 772 can be varied and the third modulating electrode 793 is in contact to the bottom of the interference region 770.

Figure 8A:
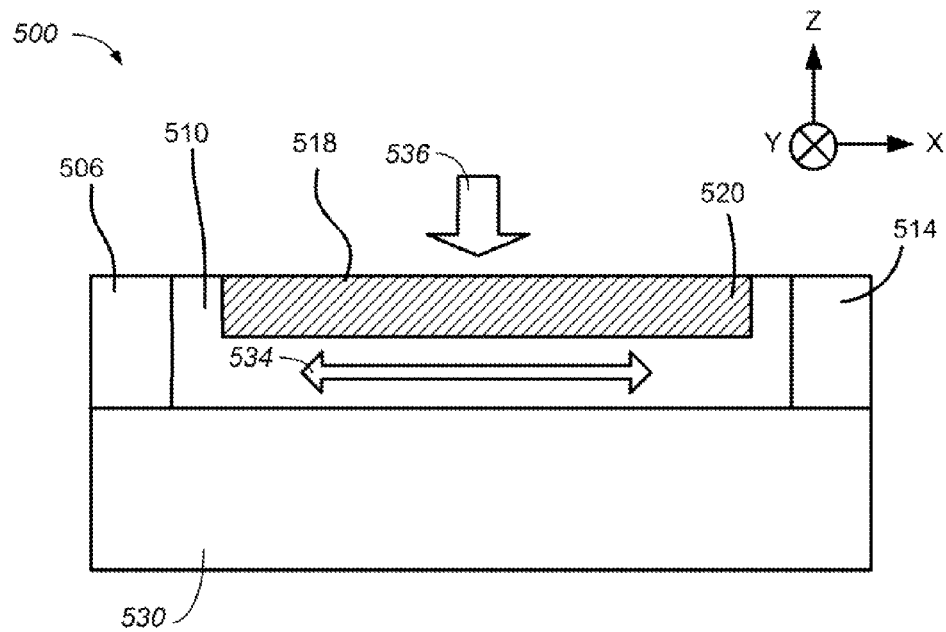
FIGS. 8A-8C show examples of an optical coupler integrated with a light detector.

FIG. 8A shows an example photonic integrated circuit 500 having an optical coupler integrated with a light detector. The photonic integrated circuit 500 includes an interference region 510, a first reflector region 506, a second reflector region 514, and a grating region 520. The interference region 510 includes a light absorption region that is configured to absorb at least a portion of the light in the interference region 510. The structures of the interference region 510, the first reflector region 506, the second reflector region 514, and the grating region 520 may be implemented by any corresponding structures described throughout this application, for example, the corresponding structures in FIGS. 1A-3E. The photonic integrated circuit 500 may be formed on a substrate 530.

The grating region 520 includes a grating 518. In some implementations, the grating 518 may be configured to receive, from an external medium, light propagating in the direction indicated by the arrow 536. Light may be coupled to the interference region 510 formed between the first reflector region 506 and the second reflector region 514. The interference region 510 is configured to confine interference light formed by light reflected by the first reflector region 506 and the second reflector region 514 along the direction indicated by the arrow 534.

The interference region 510 may be composed of a light absorption material that absorbs at least a portion of the interference light. For example, the interference region 510 may be composed of germanium that is configured to absorb light in telecommunications wavelengths. The absorbed light is converted to free carriers, which can be collected with an applied electrical field and used to determine an optical power level of the received light. In addition, light is reflected in a cavity formed by the first reflector region 506 and the second reflector region 514, providing an effective optical absorption. In some implementations, the interference region 510 includes silicon and/or germanium for light absorption and the grating region includes metal to create guided surface plasma modes.

Figure 8B:
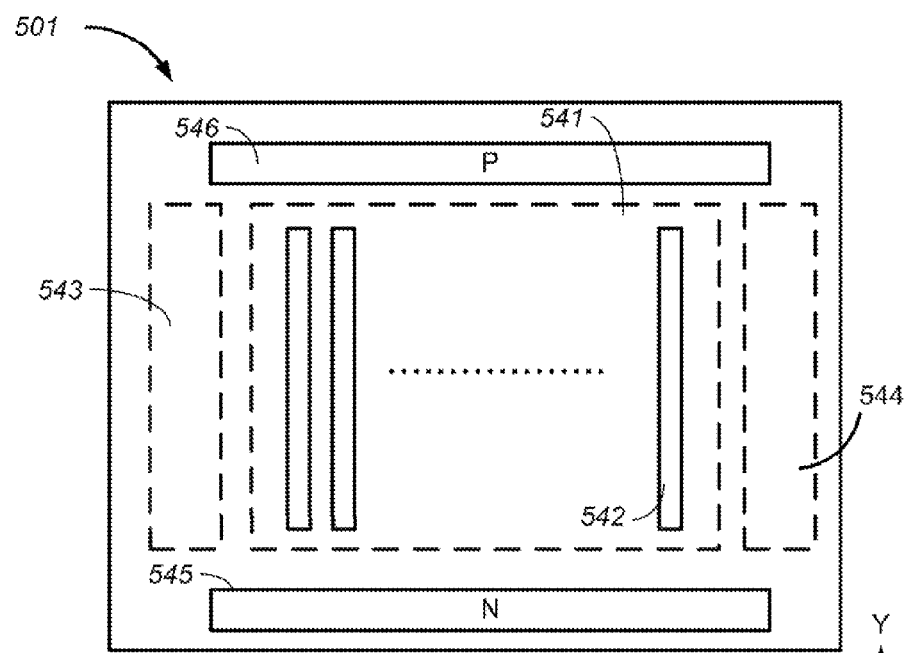

FIG. 8B shows an example photonic integrated circuit 501 having a grating based optical coupler integrated with a light detector, where the light detection efficiency can be modulated by a p-n junction. The photonic integrated circuit 501 includes an interference region 541, a p-doped region 546, an n-doped region 545, a grating 542, a first reflector region 543, and a second reflector region 544.

Similar to the descriptions of FIG. 8A, light is received from an external medium, where a portion of the light is coupled to the interference region 541 through the grating 542. The coupled light resonates along the x direction between the first reflector region 543 and the second reflector region 544 in the interference region 541. The light absorbing material in the interference region 541 absorbs the interference light and coverts the light into free carriers.

In some implementations, the n-doped region 545 and a p-doped region 546 may be configured to provide an electric field in the interference region 541 with an application of a voltage or a current across the n-doped region 545 and the p-doped region 546. The absorption efficiency of the light absorbing material in the interference region 541 may vary based on the application of the voltage or a current across the n-doped region 444 and the p-doped region 442. Therefore the application of a voltage or a current across the n-doped region 444 and the p-doped region 442 acts as a configurable or tunable photo-detector.

Figure 8C:
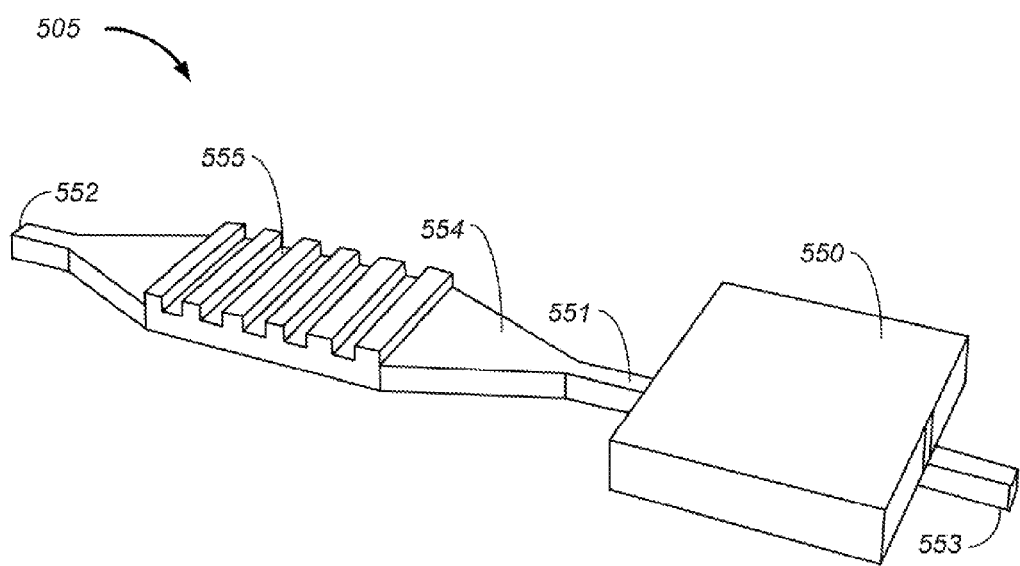

FIG. 8C shows an example photonic integrated circuit 505 having a light absorption region coupled to an interference region through a waveguide region, where a grating based optical coupler is configured to receive light from an external medium. The photonic integrated circuit 505 includes a light absorption region 550, a waveguide region 551, a first reflector region 552, a second reflector region 553, an interference region 554, and a grating region 555. The structures of the light absorption region 550, the waveguide region 551, the first reflector region 552, the second reflector region 553, the interference region 554, and the grating region 555 may be implemented by any corresponding structures described throughout this application, for example, the corresponding structures in FIGS. 1A-3E.

Here, light is coupled to the grating region 555 from an external medium. The coupled light resonates between the first reflector region 552 and the second reflector region 553 in the interference region 554 to form a standing wave pattern. A light absorption region 550 is coupled to the waveguide region 551, and light is coupled from the waveguide region 551 to the light absorption region 550 for detection. For example, the light absorption region 550 may be a germanium photo-detector bonded on a silicon waveguide, where light propagating in the silicon waveguide is confined in the interference region 554 and the waveguide region 551, and evanescently coupled to the germanium photo-detector.

FIG. 9 shows an example of an optical coupler 600 integrated with p-n junctions. The optical coupler 600 includes a first reflector region 606, an interference region 620, and a second reflector region 614. The interference region 620 includes a grating region 630. The first reflector region 606, the interference region 620, the second reflector region 614, and the grating region 630 may be implemented using any one of the corresponding regions as described throughout the application.

The optical coupler 600 also includes p-n junction pairs including p-doped regions 621, 623, and 625, and n-doped regions 631, 633, and 635. In general, by controlling one or more p-n junction pairs, parameters such as output power and output wavelength may be actively controlled by the application of voltages or carriers injection. In some implementations, the p-n junction pairs 621/631, 623/633, and/or 625/635 may extend into the first reflector region 606, the interference region 620, and/or the second reflector region 614, respectively, for better controllability. In some implementations, the p-doped and n-doped regions may alternate to form interdigitated patterns or other patterns. The descriptions of the doped regions may be applied to any one of the optical couplers described in this application.

In some implementations, an n-doped region 631 and a p-doped region 621 may be configured to provide an electric field in the first reflector region 606 with an application of a voltage or a current across the n-doped region 631 and the p-doped region 621, where the first reflector region 606 may be configured to provide a different reflectivity with the application of the voltage or a current across the n-doped region 631 and the p-doped region 621.

In some implementations, an n-doped region 635 and a p-doped region 625 may be configured to provide an electric field in the second reflector region 614 with an application of a voltage or a current across the n-doped region 635 and the p-doped region 625, wherein the second reflector region 614 may be configured to provide a different reflectivity with the application of a voltage or a current across the n-doped region 635 and the p-doped region 625.

In some implementations, an n-doped region 633 and a p-doped region 623 may be configured to provide an electric field in the interference region 620 with an application of a voltage or a current across the n-doped region 633 and the p-doped region 623, wherein the interference region 620 may be configured to provide a different interference pattern for the interference light with the application of a voltage or a current across the n-doped region 633 and the p-doped region 623.

For example, by applying a reverse bias voltage, the electric field may extract the free carriers in a region, and therefore may modify the refractive index of the region. As another example, by applying a forward bias voltage, free carriers may be injected into a region, and therefore may modify the refractive index of the region.

Figure 10A:
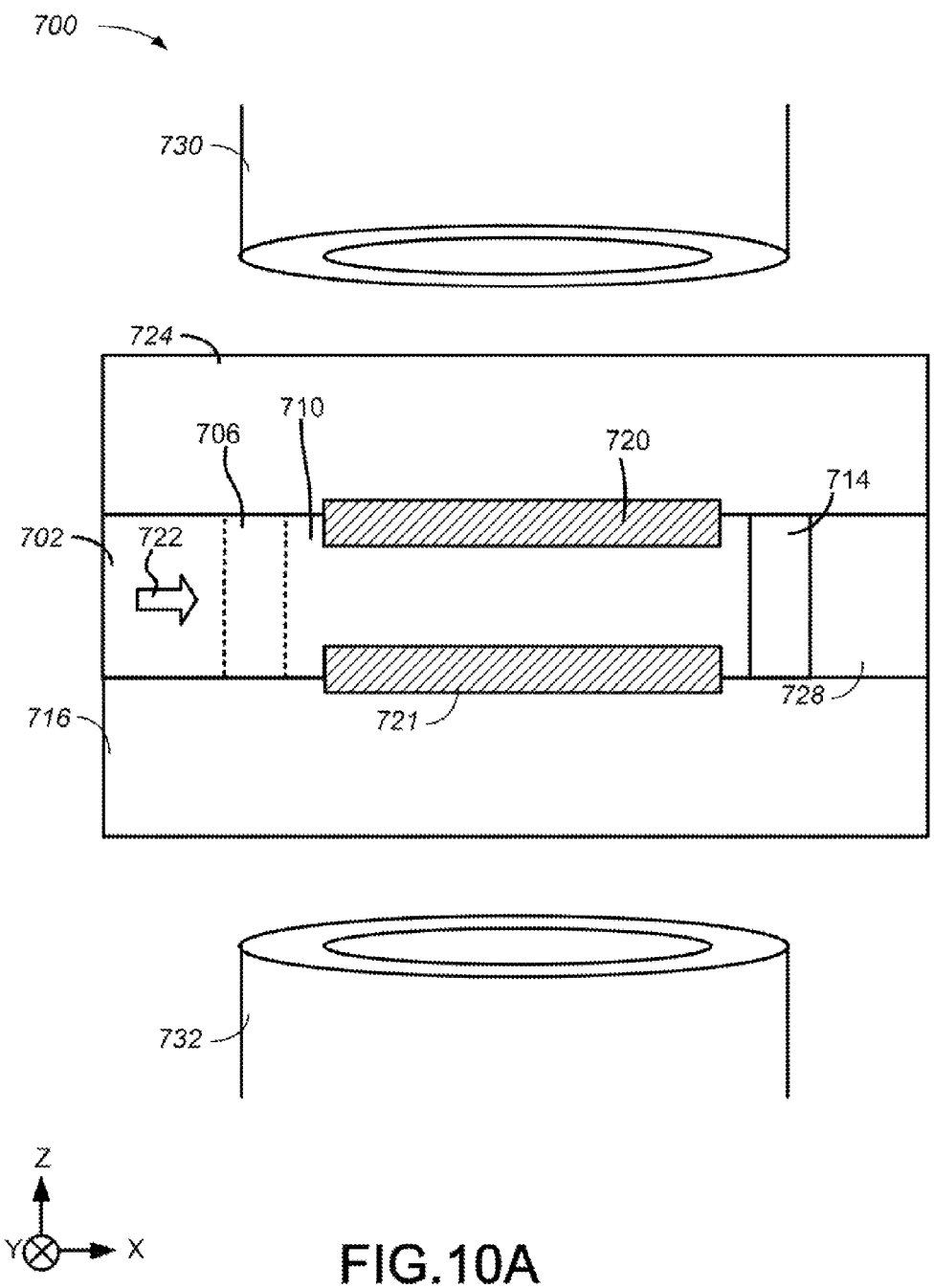
FIGS. 10A-10B show examples of an optical coupler having multiple output paths.

FIG. 10A shows an example photonic integrated circuit 700 having multiple outputs. The photonic integrated circuit 700 includes a first waveguide region 702 configured to guide line in the direction as designated by the arrow 722. The photonic integrated circuit 700 includes a first grating region 720 formed on a side of the interference region 710. The photonic integrated circuit 700 includes a second grating region 721 formed on a different side of the interference region 710, for example, the opposite side as shown in FIG. 10A. The photonic integrated circuit 700 includes a reflector region 714, and may optionally include another reflector region 706. The photonic integrated circuit 700 includes a second waveguide region 728 that may be coupled to other passive and/or active optical components.

In some implementations, light from the first waveguide region 702 enters the interference region 710, and can be directed to a first external medium 730, a second external medium 732, or a second waveguide region 728. For example, similar to the descriptions of FIG. 9, an n-doped region and a p-doped region may be configured to provide an electric field in the interference region 710 with an application of a voltage or a current across the n-doped region and the p-doped region, where the portion of the light emitted in the +z direction and the portion of the light emitted in the −z direction may be controlled by the application of a voltage or a current across the n-doped region and the p-doped region. As another example, similar to the descriptions of FIG. 9, an n-doped region and a p-doped region may be configured to provide an electric field in the second reflector region 714 with an application of a voltage or a current across the n-doped region and the p-doped region. The reflectivity of the second reflector region 714 may be tuned, and light may be transmitted to the second waveguide region 728.

In some implementations, the light enters the interference region 710, and can be split into different portions of light that exit for the first external medium 730, the second external medium 732, and/or the second waveguide region 728. For example, the grating in the first grating region 720 may be designed such that the grating periodicity substantially matches the standing wave of a TE-polarized light. Similarly, the grating in the second grating region 721 may be designed such that the grating periodicity substantially matches the standing wave of a TM-polarized light. By controlling the proportion of TE and TM polarized light in the photonic integrated circuit 700, the portions of light exiting the photonic integrated circuit 700 for the first external medium 730 and the second external medium 732 may be controlled. The above example can serve as an effective polarization beam splitter.

In some implementations, a first layer 724 may be formed between the first grating region 720 and the first external medium 730. The first layer 724 may be formed to protect the photonic integrated circuit 700, or to provide a specific distance between the first grating region 720 and the first external medium 730. In some implementations, a second layer 716 may be formed between the second grating region 721 and the second external medium 732. The second layer 716 may be formed to protect the photonic integrated circuit 700, or to provide a specific distance between the second grating region 721 and the second external medium 732. For example, the first layer 724 may be a cladding, and the second layer 716 may be a substrate of the photonic integrated circuit 700. As another example, the first layer 724 may have a lower refractive index compared to the grating region 720.

Figure 10B:
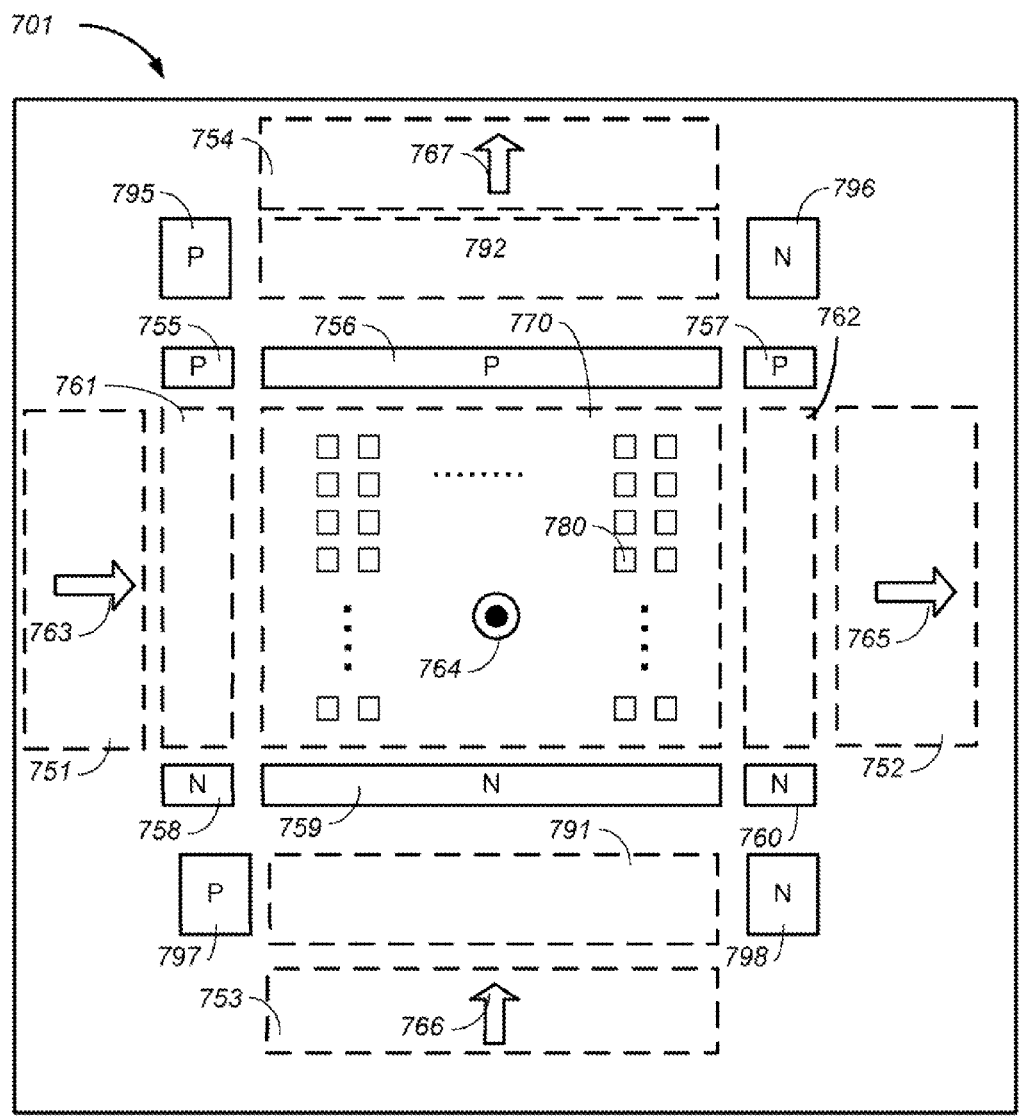

FIG. 10B shows an example photonic integrated circuit 701 having multiple inputs and outputs. The photonic integrated circuit 701 may include a first waveguide region 751, a second waveguide region 752, a third waveguide region 753, a fourth waveguide region 754, p-n junctions 755-760 and 795-798, a first reflector region 761, a second reflector region 762, a third reflector region 791, a fourth reflector region 792, an interference region 770, and a two-dimensional grating 780. The structures of the first waveguide region 751, the second waveguide region 752, the third waveguide region 753, the fourth waveguide region 754, the p-n junctions 755-760 and 795-798, the first reflector region 761, the second reflector 762, the third reflector region 791, the fourth reflector region 792, the interference region 770, and the two-dimensional grating 780 may be implemented by any corresponding structures described throughout this application, for example, the corresponding structures in FIGS. 1A-4 and FIGS. 8-9.

In some implementations, light from the first and the third waveguide region 751 and 753 enter the interference region 770, and may be directed to the second waveguide region 752, the fourth waveguide region 754, or out of the grating in the z direction as designated by the outward arrow 764.

In some implementations, to minimize the back reflection of the input light from the first and the third waveguide regions, the reflectivity of the first and the third reflector regions 761 and 791 can be tuned during the initial design or through dynamic application of electrical field to match the one-circulation attenuation coefficients of the wave propagating along the x and y direction respectively.

In some implementations, light from the first waveguide region 751 enters the interference region 770, and may be split to different portions to the second waveguide region 752, the third waveguide region 753, the fourth waveguide region 754, and/or out of the grating in the z direction as designated by the outward arrow 764. For example, the grating region may include a two-dimensional grating 780 configured to separate light into two light portions propagating along two directions x and y according to wavelengths. As another example, the grating region may include a two-dimensional grating 780 configured to separate light into two light portions propagating along two directions x and y according to polarization. As another example, the two-dimensional grating 780 may be configured to reversely combine two light portions propagating along two directions x and y into one light portion.

In some implementations, the two-dimensional grating 780 may be configured to emit light upward in the z direction by combining two lights coming from two directions x and y, by substantially matching the periods of the grating 780 along the x and y direction to periods of the interference pattern along the x and y directions respectively. In some implementations, the two-dimensional grating 780 may be configured to emit light upward in the z direction by combining two lights coming from two directions x and y, by modifying the interference pattern along the x and y directions, through the application of electrical fields between p-doped and n-doped regions, to match the grating 780 pattern along the x and y directions respectively. As another example, the two-dimensional grating 780 may be configured to reversely split one light propagating at one direction (e.g. −z) into two light portions propagating along two directions x and y.

Similar to the descriptions of FIG. 10A, in some implementations, an n-doped region and a p-doped region may be configured to provide an electric field in the interference region with an application of a voltage or a current across the n-doped region and the p-doped region, where a respective proportion of each of the two light portions propagating along two directions is controlled by the application of a voltage or a current across the n-doped region and the p-doped region. For example, a voltage may be applied across the n-doped region 759 and the p-doped region 756 to control the routing or the splitting of the input light. In some implementations, one or more doped regions can be eliminated if there is no need to modulate the refractive index of corresponding regions. For example, the doped regions 756 and 759 can be eliminated if there is no need to dynamically modulate the interference region 770.

Figure 11:
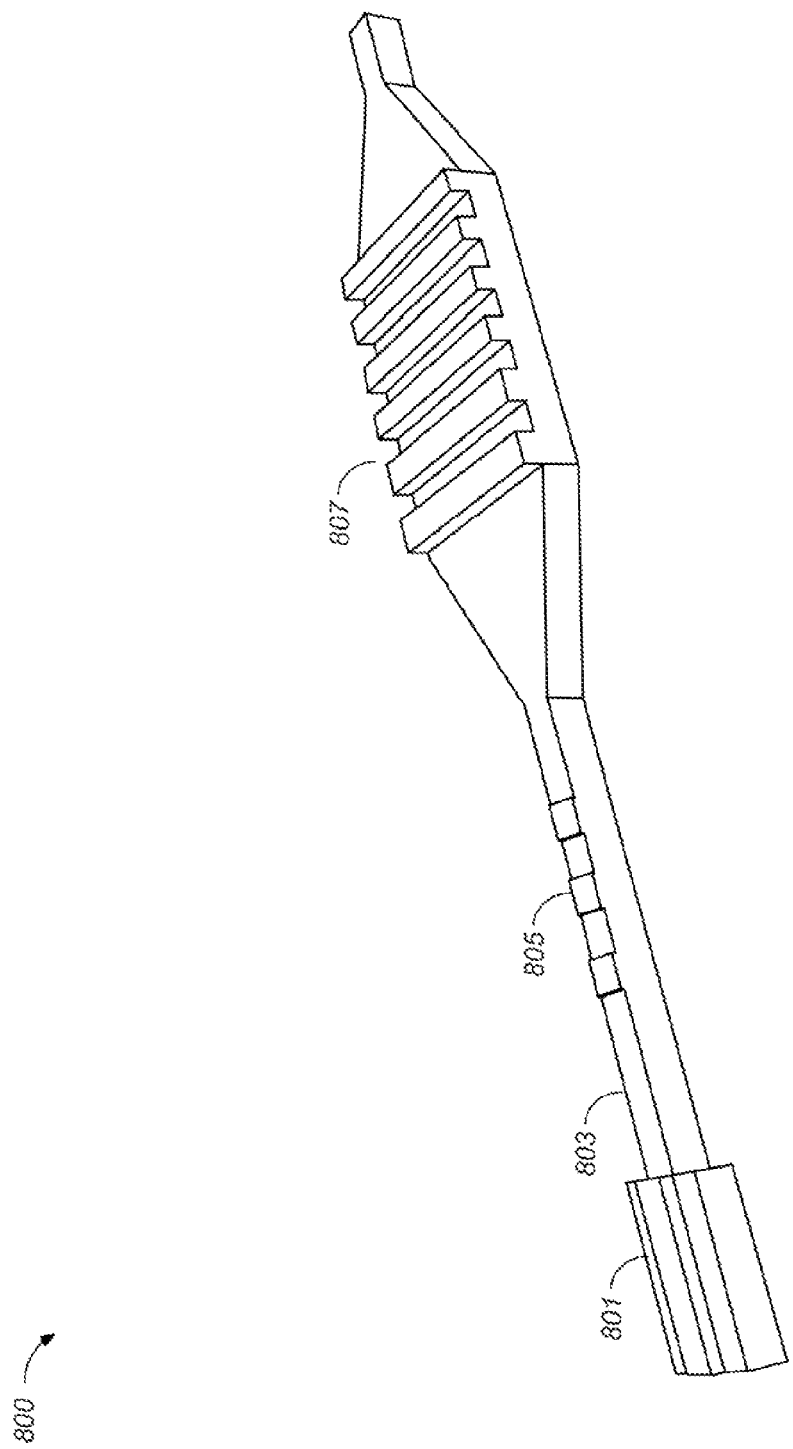
FIG. 11 shows an example of an optical coupler for packaging.

FIG. 11 shows an example of a photonic integrated circuit 800 suitable for packaging. The photonic integrated circuit 800 includes an edge emitting light source 801 that is butt-coupled to a waveguide 803. The light may be modulated by optionally including an integrated modulator 805 as shown in FIG. 11, or through direct modulation of the edge emitting light source 801. The modulated light is coupled to a grating-based optical coupler 807 as described in previous figures. Since light emitted by the optical coupler 807 may be designed to emit along a direction that is substantially perpendicular than the direction of light emitted by the edge emitting light source 801, the photonic integrated circuit 800 may be readily tested and packaged with a standardized optical equipment. For example, the die where the photonic integrated circuit 800 is fabricated on may be attached to the inside surface of a transistor outline (TO) metal can, where the grating may be aligned to the aperture of the TO metal can, allowing vertical transmission of light out of the package.

Figure 12A:
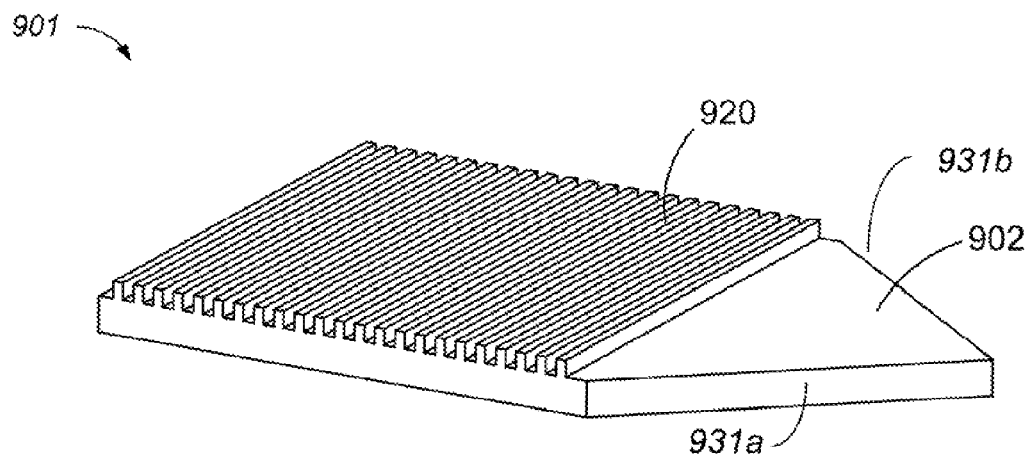
FIGS. 12A-12E show examples of a mirror.

FIG. 12A shows an example of an optical apparatus 901, including a corner mirror 902 that provides a high-reflectivity. The descriptions of FIG. 12A may be applied to any one of the reflector regions disclosed in this application. In general, light propagates through the grating region 920, and is incident on the facets 931a and 931b of the corner mirror 902. Because the light is incident on the facets 931a and 931b beyond a total reflection angle, substantial light is reflected due to total reflection, achieving a high-reflectivity.

Figure 12B:
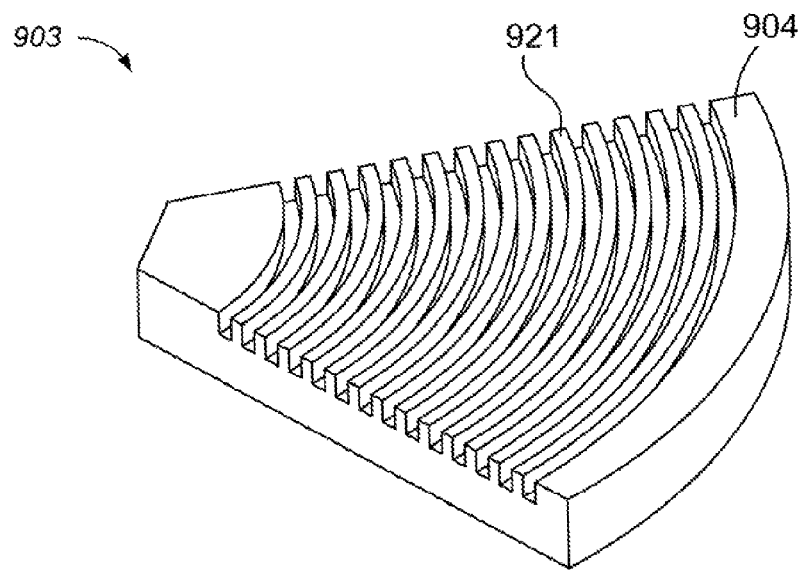

FIG. 12B shows an example of an optical apparatus 903, including a circular or elliptical facet 904 that provides a partial-reflectivity or a high-reflectivity. The descriptions of FIG. 12B may be applied to any one of the reflector regions disclosed in this application. In general, light propagates through the curved grating region 921, and is incident on the facet 904. In some implementations, the facet 904 may be coated with a metal layer to provide a high-reflectivity. The curved facet 904 refocuses the light back toward the direction of the waveguide region by the high-reflectivity curved facet 904.

Figure 12C:
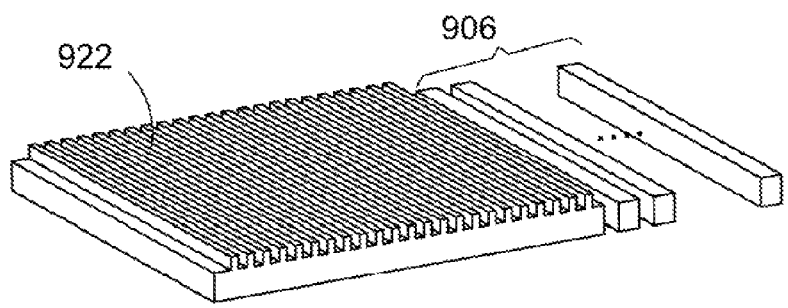

FIG. 12C shows an example of an optical apparatus 905, including a distributed Bragg reflector (DBR) mirror 906 providing a high-reflectivity. The descriptions of FIG. 12C may be applied to any one of the reflector regions disclosed in this application. In general, light propagates through the grating region 922, and is incident on DBR mirror 906. In some implementations, the DBR mirror 906 may be designed to provide a high reflectivity for a range of wavelengths.

Figure 12D:
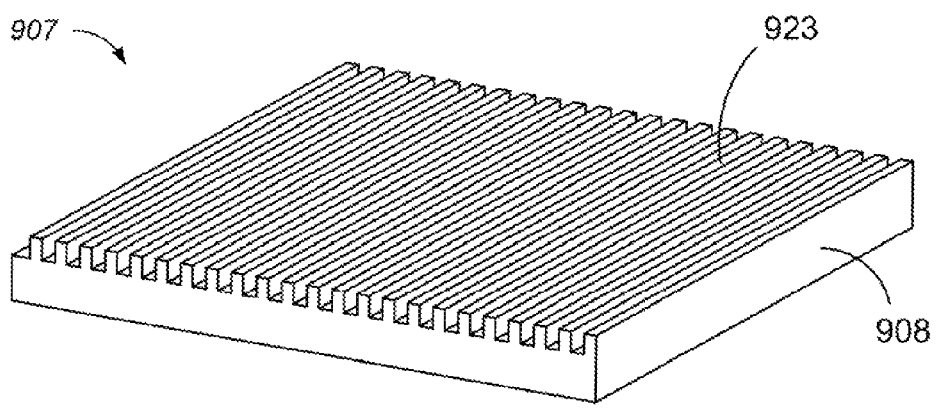

FIG. 12D shows an example of an optical apparatus 907, including a facet 908 providing a partial-reflectivity or a high-reflectivity. The descriptions of FIG. 12D may be applied to any one of the reflector regions disclosed in this application. In general, light propagates through the grating region 923, and is incident on the facet 908. Without any additional coating, the reflectivity may be determined using the Fresnel equations. In some implementations, the facet 908 may be coated with one or more layers of materials to increase the reflectivity. For example, the facet 908 may be coated with a metal layer to increase the reflectivity. As another example, the facet 908 may be coated with multiple dielectric layers to increase the reflectivity for a range of wavelengths. As another example, the facet 908 may be coated with a quarter-wavelength dielectric layer followed by a metal layer to increase the reflectivity for a range of wavelengths.

Figure 12E:
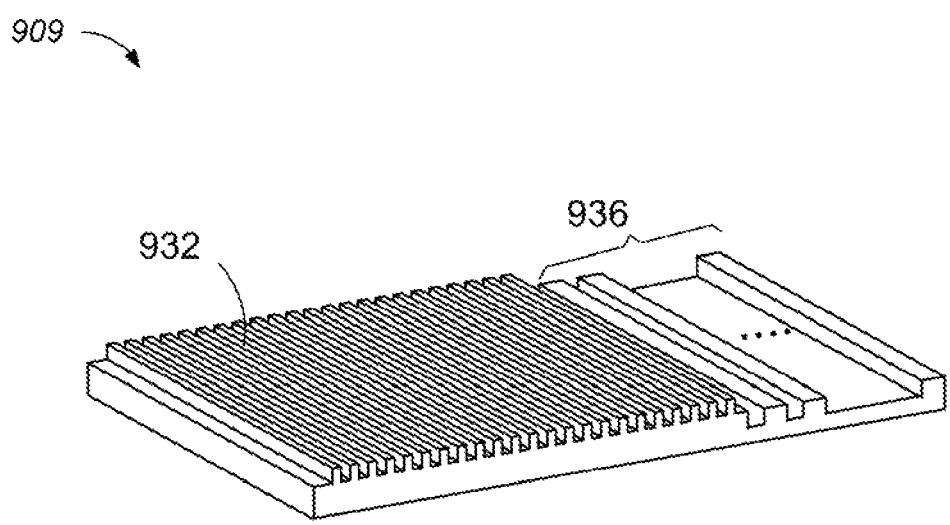

FIG. 12E shows an example of an optical apparatus 909, including a surface corrugated mirror 936. The descriptions of FIG. 12E may be applied to any one of the reflector regions disclosed in this application. In general, light propagates through the grating region 932, and is incident into the mirror 936 and gets reflected, forming an interference pattern.

Any other types of reflectors that can be integrated in a photonic integrated circuit may also be used as alternatives to the reflectors described in FIGS. 12A-12E. For example, a reflector region may alternatively include an anomalously dispersive mirror or a waveguide loop mirror.

Figure 13:
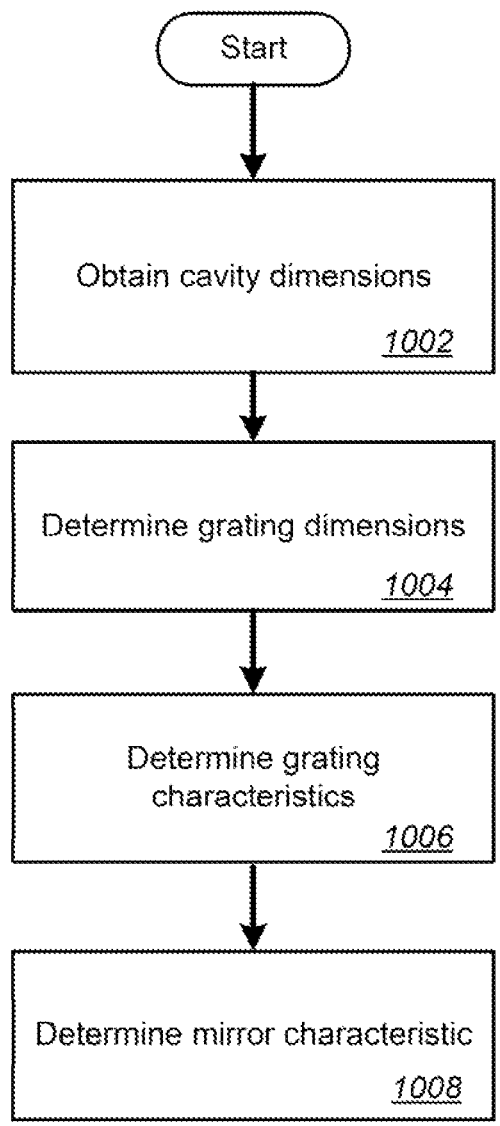
FIG. 13 shows an example of a flow diagram for designing an optical coupler.

FIG. 13 shows an example of a flow diagram for designing an optical coupler. The process 1000 may be performed by data processing apparatus, such as one or more computers.

The system obtains cavity dimensions (1002). In some implementations, based on the target light polarization/mode/wavelength/spot size, and the external medium (e.g., fiber on top of the grating or waveguide connected to the second side 114, etc.), the dimensions and materials of the cavity and the substrate can be determined. For example, for a single mode optical signal with center wavelength around 1310 nm, a Si layer cavity having a thickness of 250 nm on an oxide layer can be used. If the spot size of the external fiber is around 10 μm, the dimension of the cavity needs to be around or larger than 10 μm to allow the external fiber to be coupled onto the grating structure.

The system determines grating dimensions (1004). In general, the design of the grating dimensions depends on the standing wave pattern inside the cavity. The period of the grating pattern needs to be substantially matched to the standing wave pattern, and the other parameters, such as the duty cycle, and grating height, shape of the grating structure, are other design parameters that may be optimized based on parameters such as the incident light spot size, mode of the light, wavelength of the light, material of the cavity, intended emitting angle, etc. The standing wave pattern can be estimated assuming a specific mirror reflectivity.

The system determines grating characteristics (1006). For example, a numerical analysis tool such as a FDTD simulation system can be used to optimize the design parameters until a high directionality and the intended emission angle, for example a substantially vertical emission, are both reached.

The system determines mirror characteristics (1008). In some implementations, a numerical analysis tool such as a FDTD simulation system may optimize design parameters to generate a design for a back mirror having a reflection that is close to 100%. For example, the design may be a tapered waveguide distributed Bragg reflector (DBR), a waveguide loop mirror, or a Si—SiO2-metal coating layer.

In some implementations, the FDTD simulation system may be used to determine the one-circulation attenuation coefficient α, as described in FIG. 2. Based on the calculated one-circulation attenuation coefficient α, the system may design a front mirror having a reflectivity that substantially matches the one-circulation attenuation coefficient α. In some implementations, multiple doped regions can be placed near the regions to modify the properties of the regions through the application of electrical field.

In some implementations of the design flow, after obtaining the cavity dimensions (1002), a proper mirror design (e.g., tapered DBR or corner mirror or oxide-metal coating, etc.) can be determined to form the interference wave pattern. Then, grating structure on top of the interference region can be designed based on the initial interference wave pattern. By adding the grating structure, characteristics of the interference region may change, resulting in a modification of the interference wave pattern in the interference region. Therefore, some iteration processes might be needed for optimization. Based on the material quality and the physical dimensions of the interference region and the grating, the one circulation attenuation coefficient (α) can be determined along with the corresponding phase shift for the resonant condition. Then another mirror or reflector can be added on another side of the interference region.

Figure 14:
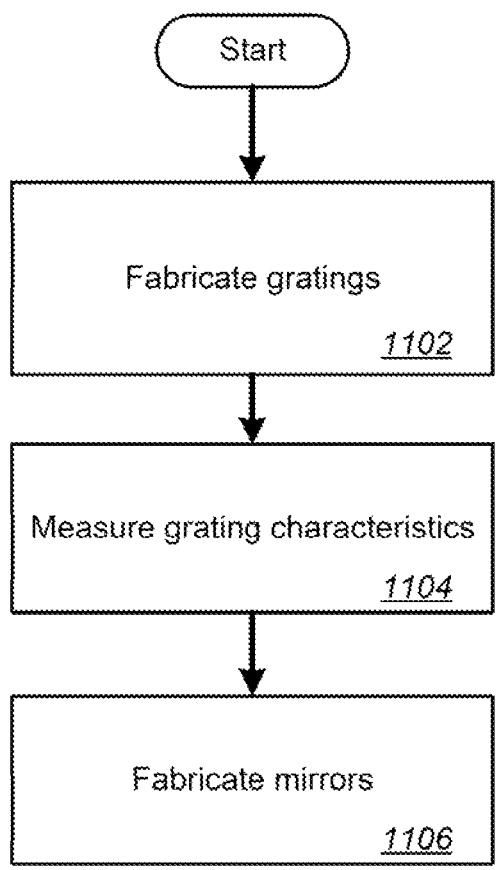
FIG. 14 shows an example of a flow diagram for fabricating an optical coupler.

FIG. 14 shows an example of a flow diagram for fabricating an optical coupler. The process 1100 may be performed by a system including data processing apparatus, such as one or more computers that control one or more apparatuses that perform the fabrication steps.

The system fabricates gratings (1102). The fabrication of gratings may be done by a combination of CMOS compatible fabrication techniques. For example, lithography techniques such as projection lithography, electronic-beam lithography, contact lithography, or any other suitable lithography techniques may be used to pattern the gratings. As another example, etching techniques such as dry etching, wet etching, or any other suitable etching techniques may be used to etch the patterned gratings. As another example, thin film deposition techniques such as chemical vapor deposition, plasma-enhanced chemical vapor deposition, sputtering, or any other suitable thin film deposition techniques may be used to deposit one or more layers of materials on the gratings.

The system can also optionally measure grating characteristics (1104) as a mid-process check point. In some implementations, the measurement of grating characteristics may be performed on a die level. In some implementations, the measurement of grating characteristics may be performed on a wafer level. In some implementations, input light is coupled into a photonic integrated circuit through a fabricated grating on the input end, and output light is coupled out of the photonic integrated circuit through another fabricated grating on the output end. In some implementations, input light is coupled into a photonic integrated circuit through a fabricated grating, where the light is reflected by a high-reflectivity reflector. The reflected light may be coupled out of the photonic integrated circuit through the same grating, and separated out by an optical circulator. The grating characteristics such as the one-circulation attenuation coefficient may be measured and analyzed by comparing the output light with the input light. In some implementations, the measurement of grating characteristics may be performed by shining a light at a tilt angle onto the fabricated grating and measure the reflected light at another angle.

The system fabricates mirrors (1106). In some implementations, after the system determines the one-circulation attenuation coefficient, the system can optimize the parameters for a reflector that matches the one-circulation attenuation coefficient. The fabrication of the one or more reflectors may be done by a combination of CMOS compatible fabrication techniques. In some implementations, the doped regions can be lithography defined, implanted and activated at locations near the regions needs to be modified through the application of electrical field.

Figure 15:
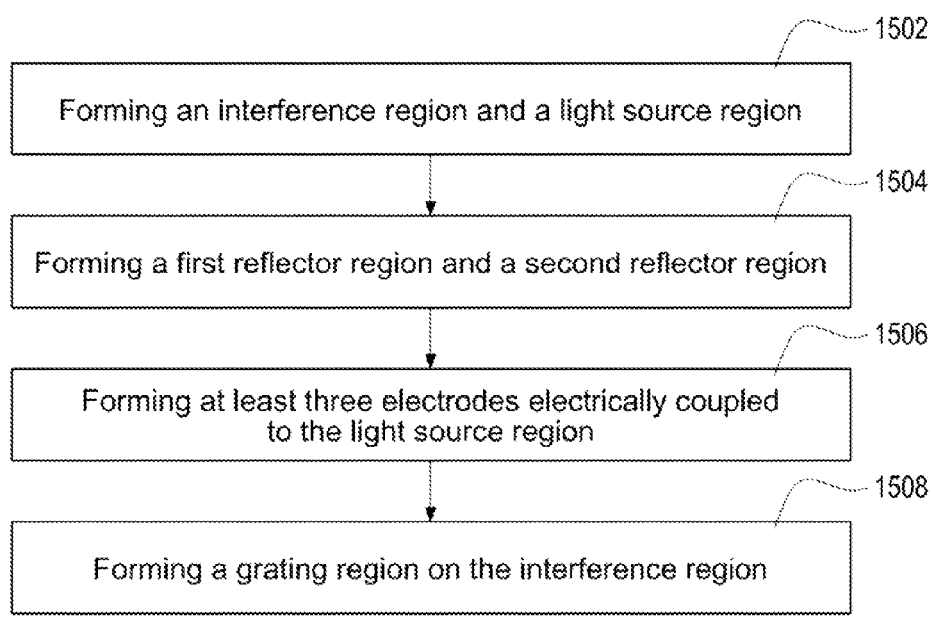
FIG. 15 shows an example of a flow diagram for fabricating a grating based optical transmitter with three electrodes.

FIG. 15 shows an example of a flow diagram for fabricating an optical transmitter. First an interference region and a light source region are formed (1502), where at least part of the light source region is embedded in the interference region. The manufacture of the interference region can be referred to description corresponding to step 1002. A first reflector region and a second reflector region are formed at two opposite ends of the interference region (1504), wherein the first and second reflector regions are formed on a layer. The formation of the first and second reflector regions can be referred to description corresponding to step 1008 or step 1106. At least three electrodes electrically coupled to the light source region are formed (1506), the three electrodes are arranged to provide a control for relative electrical fields among the three electrodes to modulate an electrical carrier concentration. Light generated by the electrical carrier recombination resonates inside the interference region along a first direction and emits out of the interference region along a second direction that is different from the first direction. A grating region is formed on the interference region between the first reflector region and the second reflector region (1508).

A number of implementations have been described. Nevertheless, it will be understood that various modifications may be made without departing from the spirit and scope of the disclosure. For example, various forms of the flows shown above may be used, with steps re-ordered, added, or removed. For example, in FIG. 13, step 1008 can also be done before step 1004. As another example, in FIG. 14, step 1104 can also be done after step 1106. As another example, in FIG. 15, step 1506 can also be done before step 1504.

Various implementations may have been discussed using two-dimensional cross-sections for easy description and illustration purpose. Nevertheless, the three-dimensional variations and derivations should also be included within the scope of the disclosure as long as there are corresponding two-dimensional cross-sections in the three-dimensional structures.

Embodiments and all of the functional operations described in this specification may be implemented in digital electronic circuitry, or in computer software, firmware, or hardware, including the structures disclosed in this specification and their structural equivalents, or in combinations of one or more of them. Embodiments may be implemented as one or more computer program products, i.e., one or more modules of computer program instructions encoded on a computer-readable medium for execution by, or to control the operation of, data processing apparatus. The computer readable-medium may be a machine-readable storage device, a machine-readable storage substrate, a memory device, a composition of matter affecting a machine-readable propagated signal, or a combination of one or more of them. The computer-readable medium may be a non-transitory computer-readable medium. The term "data processing apparatus" encompasses all apparatus, devices, and machines for processing data, including by way of example a programmable processor, a computer, or multiple processors or computers. The apparatus may include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal that is generated to encode information for transmission to suitable receiver apparatus.

A computer program (also known as a program, software, software application, script, or code) may be written in any form of programming language, including compiled or interpreted languages, and it may be deployed in any form, including as a standalone program or as a module, component, subroutine, or other unit suitable for use in a computing environment. A computer program does not necessarily correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program may be deployed to be executed on one computer or on multiple computers that are located at one site or distributed across multiple sites and interconnected by a communication network.

The processes and logic flows described in this specification may be performed by one or more programmable processors executing one or more computer programs to perform functions by operating on input data and generating output. The processes and logic flows may also be performed by, and apparatus may also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer may be embedded in another device, e.g., a tablet computer, a mobile telephone, a personal digital assistant (PDA), a mobile audio player, a Global Positioning System (GPS) receiver, to name just a few. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD-ROM and DVD-ROM disks. The processor and the memory may be supplemented by, or incorporated in, special purpose logic circuitry.

To provide for interaction with a user, embodiments may be implemented on a computer having a display device, e.g., a CRT (cathode ray tube) or LCD (liquid crystal display) monitor, for displaying information to the user and a keyboard and a pointing device, e.g., a mouse or a trackball, by which the user may provide input to the computer. Other kinds of devices may be used to provide for interaction with a user as well; for example, feedback provided to the user may be any form of sensory feedback, e.g., visual feedback, auditory feedback, or tactile feedback; and input from the user may be received in any form, including acoustic, speech, or tactile input.

Embodiments may be implemented in a computing system that includes a back end component, e.g., as a data server, or that includes a middleware component, e.g., an application server, or that includes a front end component, e.g., a client computer having a graphical user interface or a Web browser through which a user may interact with an implementation of the techniques disclosed, or any combination of one or more such back end, middleware, or front end components. The components of the system may be interconnected by any form or medium of digital data communication, e.g., a communication network. Examples of communication networks include a local area network ("LAN") and a wide area network ("WAN"), e.g., the Internet.

The computing system may include clients and servers. A client and server are generally remote from each other and typically interact through a communication network. The relationship of client and server arises by virtue of computer programs running on the respective computers and having a client-server relationship to each other.

While this specification contains many specifics, these should not be construed as limitations, but rather as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems may generally be integrated together in a single software product or packaged into multiple software products.

Thus, particular embodiments have been described. Other embodiments are within the scope of the following claims. For example, the actions recited in the claims may be performed in a different order and still achieve desirable results.

Note that any and all of the embodiments described above can be combined with each other, except to the extent that it may be stated otherwise above or to the extent that any such embodiments might be mutually exclusive in function and/or structure.

Although the present invention has been described with reference to specific exemplary embodiments, it will be recognized that the invention is not limited to the embodiments described, but can be practiced with modification and alteration within the spirit and scope of the appended claims. Accordingly, the specification and drawings are to be regarded in an illustrative sense rather than a restrictive sense.

What is claimed is:

1. An optical transmitter, comprising:
an interference region configured to confine resonant light between a first reflector region and a second reflector region along a first direction, the interference region having an upper plane and a bottom plane, wherein a normal direction to said upper plane and to said bottom plane is along a second direction that is substantially perpendicular to the first direction;
a first electrode and a second electrode electrically coupled to the interference region, the first electrode and the second electrode configured to generate light in the interference region through an electrical carrier injection by an electrical field applied between the first electrode and the second electrode along a third direction that is substantially perpendicular to the first direction and the second direction;
a third electrode electrically coupled to the interference region, the third electrode being configured to modulate an electrical carrier concentration in the interference region by an electrical field applied between the first electrode and the third electrode or between the second electrode and the third electrode; and a grating region formed on the upper plane of the interference region and configured to emit at least a portion of the resonant light out of the interference region along the second direction through an opposite side of the grating region on the bottom plane;

wherein a dielectric layer is formed between the third electrode and the interference region and the third electrode is configured to modulate the electrical carrier recombined in the interference region through a capacitive effect, and wherein the electrical carrier infection along the third direction is perpendicular to the light resonance direction along the first direction.

2. The optical transmitter of claim 1, wherein the interference region contains at least two different layers of materials and the first electrode and the third electrode are physically in contact to the different layers of materials of the interference region.

3. The optical transmitter of claim 1, wherein the first reflector region or the second reflector region includes one of a corner mirror, a DBR mirror, a dispersive mirror, a waveguide loop mirror, or a metal layer.

4. The optical transmitter of claim 1, wherein the first electrode, the second electrode or the third electrode includes a conducting layer and a doped semiconductor region.

5. The optical transmitter of claim 1, wherein at least two different voltage levels can be applied to the third electrode in sequence to modulate the amount of electrical carriers recombined in the interference region and the output light power level.

6. The optical transmitter of claim 1, wherein the grating has lattice vectors formed so that the locations of the in-phase antinodes of the light inside the interference region substantially match the locations of the grating valleys or peaks.

7. The optical transmitter of claim 1, wherein at least part of the interference region that the third electrode is physically in contact to is not overlapping with the grating region.

8. The optical transmitter of claim 1, wherein at least part of the third electrode is reflective to the light emitting from the interference region.

9. A method for forming an optical transmitter, the method comprising:

forming an interference region and a light source region wherein at least part of the light source region is embedded in the interference region;

forming a first reflector region and a second reflector region at two opposite ends of the interference region along a first direction;

forming at least three electrodes electrically coupled to the light source region, and at least two of the three electrodes being arranged to infect electrical carriers along a second direction perpendicular to the first direction and the third electrode arranged to provide a control for relative electrical fields among the three electrodes to modulate an electrical carrier concentration through a capacitive effect;

wherein light generated by the electrical carriers recombination resonates inside the interference region along the first direction and emits out of the interference region along a third direction perpendicular to the first direction and the second direction.

10. The method of claim 9, further comprising forming a grating region on the interference region between the first reflector region and the second reflector region, wherein the resonant light can be emitted through a bottom side of the grating region.

* * * * *